(12) United States Patent
Matsutani et al.

(10) Patent No.: US 10,715,109 B2
(45) Date of Patent: Jul. 14, 2020

(54) RADIO FREQUENCY FRONT-END CIRCUIT AND COMMUNICATION DEVICE

(71) Applicant: Murata Manufacturing Co., Ltd., Kyoto (JP)

(72) Inventors: Kei Matsutani, Kyoto (JP); Koji Nosaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/353,037

(22) Filed: Mar. 14, 2019

(65) Prior Publication Data

US 2019/0214968 A1  Jul. 11, 2019

Related U.S. Application Data

(63) Continuation of application No. PCT/JP2017/032149, filed on Sep. 6, 2017.

(30) Foreign Application Priority Data

Sep. 16, 2016 (JP) ................................ 2016-182384

(51) Int. Cl.
*H03H 9/64* (2006.01)
*H03H 9/72* (2006.01)
(Continued)

(52) U.S. Cl.
CPC ................ *H03H 9/64* (2013.01); *H03F 3/189* (2013.01); *H03F 3/195* (2013.01); *H03F 3/72* (2013.01);
(Continued)

(58) Field of Classification Search
CPC .................................... H03H 9/64; H03H 9/72
See application file for complete search history.

(56) References Cited

U.S. PATENT DOCUMENTS

2002/0180562 A1  12/2002  Taniguchi
2009/0201104 A1   8/2009  Ueda et al.
(Continued)

FOREIGN PATENT DOCUMENTS

JP  H10-336000 A   12/1998
JP  2002-314372 A  10/2002
(Continued)

OTHER PUBLICATIONS

International Search Report for International Application No. PCT/JP2017/032149, dated Nov. 28, 2017.
(Continued)

*Primary Examiner* — Tuan H Nguyen
(74) *Attorney, Agent, or Firm* — Pearne & Gordon LLP

(57) ABSTRACT

A radio frequency front-end circuit includes a first filter that is a frequency variable filter connected to a first select terminal of a switching circuit, and a second filter connected to a second select terminal of the switching circuit. The switching circuit includes a first switch that switches over conduction and non-conduction between a common terminal and the second select terminal. The first filter includes a serial arm resonance circuit connected to the first select terminal, a parallel arm resonator, and a frequency varying circuit. The frequency varying circuit includes a capacitor and a third switch connected in parallel to each other, and is connected in series to the parallel arm resonator. The frequency varying circuit shifts a frequency of the first filter depending on conduction and non-conduction of the third switch.

21 Claims, 23 Drawing Sheets

(51) Int. Cl.
| | | |
|---|---|---|
| *H04B 1/40* | (2015.01) | |
| *H03F 3/72* | (2006.01) | |
| *H03H 9/70* | (2006.01) | |
| *H03H 9/58* | (2006.01) | |
| *H04B 1/18* | (2006.01) | |
| *H04B 1/48* | (2006.01) | |
| *H03F 3/195* | (2006.01) | |
| *H03H 7/46* | (2006.01) | |
| *H04B 1/00* | (2006.01) | |
| *H03F 3/189* | (2006.01) | |
| *H03H 9/145* | (2006.01) | |

(52) U.S. Cl.
CPC ............... *H03H 7/46* (2013.01); *H03H 9/58* (2013.01); *H03H 9/70* (2013.01); *H03H 9/72* (2013.01); *H04B 1/00* (2013.01); *H04B 1/18* (2013.01); *H04B 1/40* (2013.01); *H04B 1/48* (2013.01); *H03F 2200/451* (2013.01); *H03H 9/14541* (2013.01)

(56) References Cited

U.S. PATENT DOCUMENTS

| | | | |
|---|---|---|---|
| 2009/0251235 A1* | 10/2009 | Belot | H03H 9/542 |
| | | | 333/187 |
| 2011/0294445 A1 | 12/2011 | Goto et al. | |
| 2016/0301379 A1* | 10/2016 | Ikada | H03H 7/465 |

FOREIGN PATENT DOCUMENTS

| | | |
|---|---|---|
| JP | 2009-207116 A | 9/2009 |
| JP | 2011-249466 A | 12/2011 |
| JP | 2012-054635 A | 3/2012 |
| WO | 2015/098791 A1 | 7/2015 |

OTHER PUBLICATIONS

Written Opinion for International Application No. PCT/JP2017/032149, dated Nov. 28, 2017.

* cited by examiner

RADIO FREQUENCY FRONT-END CIRCUIT AND COMMUNICATION DEVICE

This is a continuation of International Application No. PCT/JP2017/032149 filed on Sep. 6, 2017 which claims priority from Japanese Patent Application No. 2016-182384 filed on Sep. 16, 2016. The contents of these applications are incorporated herein by reference in their entireties.

BACKGROUND OF THE DISCLOSURE

Field of the Disclosure

The present invention relates to a radio frequency front-end circuit including a plurality of filters, and to a communication device.

Description of the Related Art

Hitherto, there is known a circuit configuration including a switch having a common terminal and a plurality of individual terminals (select terminals), a filter connected to one of the individual terminals and having a fixed frequency, and a frequency variable filter (tunable filter) connected to another one of the individual terminals (see, e.g., Patent Document 1). Regarding the frequency variable filter, there is known a filter configuration in which a circuit including a capacitor and a switch connected in parallel to each other is connected in series to a parallel arm resonating device (parallel arm resonator) in a ladder filter (see, e.g., Patent Document 2). Such an acoustic wave filter can shift (vary) the frequency of an attenuation pole with switching between a conducted (turned-on) state and a non-conducted (turned-off) state of the switch.

Patent Document 1: International Publication No. 2015/098791
Patent Document 2: U.S. Patent Application Publication No. 2009/0251235

BRIEF SUMMARY OF THE DISCLOSURE

However, in a radio frequency front-end circuit in which the tunable filter disclosed in Patent Document 2 is used as the tunable filter disclosed in Patent Document 1, at least one of size and loss in a pass band is possibly increased. More specifically, a semiconductor device, such as a FET, generally used as a switch in radio frequency circuits exhibits a trade-off relation between a size and an on-resistance. The term "on-resistance" stands for a resistance component when the semiconductor device is turned on. Thus, in the case of using a switch with a small on-resistance, the switch size is increased and the overall size of the radio frequency front-end circuit is increased. On the other hand, in the case of using a small-sized switch, the on-resistance of the switch is increased and the loss in the pass band is increased.

An object of the present invention is to provide a radio frequency front-end circuit and a communication device in which size reduction can be realized and a loss in a pass band can be reduced concurrently.

To achieve the above object, a radio frequency front-end circuit according to an embodiment of the present invention includes a switch circuit having a common terminal, a first select terminal, and a second select terminal, the first and second select terminals being selectively connected to the common terminal; a first filter that is a frequency variable filter connected to the first select terminal; and a second filter connected to the second select terminal, the switch circuit including a first switch element that switches over conduction and non-conduction between the common terminal and the first select terminal; and a second switch element that switches over conduction and non-conduction between the common terminal and the second select terminal, the first filter including a first input/output terminal and a second input/output terminal; one or more serial arm resonance circuits connected to the first select terminal and disposed in a path connecting the first input/output terminal and the second input/output terminal; a first parallel arm resonator connected between a node on the path and a ground; and a frequency varying circuit that is a circuit including a first impedance element and a third switch element connected in parallel to each other, and that is connected in series to the first parallel arm resonator between the node and the ground, wherein the frequency varying circuit is able to shift a frequency of at least one attenuation pole of the first filter depending on switching between conduction and non-conduction of the third switch element, and an on-resistance of the first switch element is smaller than an on-resistance of the third switch element.

Here, even when the on-resistance of the third switch element of the frequency varying circuit is large, an influence upon the characteristics of the first filter is small, and hence an increase of insertion loss in a pass band of the radio frequency front-end circuit is less apt to occur. In contrast, when the on-resistance of the first switch element of the switch circuit is increased, the insertion loss in the radio frequency front-end circuit is also increased in proportion to the increase of that on-resistance. Moreover, in each of the first switch element and the third switch element, the size and the on-resistance are in a trade-off relation. By setting the on-resistance of the first switch element to be smaller than the on-resistance of the third switch element of the frequency varying circuit in the first filter, therefore, the size of the third switch element can be reduced while the increase of the insertion loss in the pass band can be suppressed. Thus, with the radio frequency front-end circuit according to this embodiment, a loss in the pass band can be reduced and size reduction can be realized concurrently.

The first input/output terminal may be connected to the first select terminal. When an on-resistance ratio given as a value of the on-resistance of the first switch element relative to the on-resistance of the third switch element is changed on an assumption that an insertion loss between the common terminal and the second input/output terminal in a pass band of the first filter in a state of the first switch element and the third switch element being both turned on is set to an arbitrary fixed value, a total area of an area in which the first switch element is formed and an area in which the third switch element is formed may be expressed by a function having a downward convex shape and taking a minimum value when the on-resistance ratio is less than 1. In addition, assuming that the total area obtained when the on-resistance ratio is 1 is a reference area, and that the on-resistance ratio obtained when the total area takes the reference area in a monotonously decreasing region of the function having a downward convex shape is denoted by α, the first switch element and the third switch element may be constituted such that the on-resistance ratio falls within a range of greater than α and smaller than 1.

Here, if the on-resistance ratio is too large or too small, a total size resulting from adding the size of the first switch element and the size of the third switch element and the insertion loss in the pass band increase. In other words, the loss reduction in the pass band and the size reduction can be both realized by setting the on-resistance ratio to fall within the appropriate range.

The first switch element and the third switch element may be constituted such that the on-resistance ratio $\alpha$ falls within a range of greater than 0.24 and smaller than 1.

The above-mentioned $\alpha$ depends on a maximum voltage ratio, i.e., a ratio of a maximum voltage applied to the first switch element to a maximum voltage applied to the third switch element, and $\alpha$ increases as the maximum voltage ratio increases. In addition, the maximum voltage ratio is specified by the circuit configuration, etc. Therefore, if $\alpha$ is too small, the total size resulting from adding the size of the first switch element and the size of the third switch element and the insertion loss in the pass band increase. In other words, since the first switch element and the third switch element are constituted such that $\alpha$ falls within the appropriate range, the loss reduction in the pass band and the size reduction can be both realized.

Each of the first switch element and the third switch element may be constituted by one switch element or a plurality of switch elements formed by splitting one switch element in series, and the number of switch elements constituting the third switch element may be greater than the number of switch elements constituting the first switch element.

With the above features, when the first switch element and the third switch element are each constituted by the plurality of switch elements, an RF voltage applied to the switch element can be divided to be separately applied to the plurality of switch elements connected in series. Hence the withstand voltage can be raised by increasing the number of switch elements connected in series.

Here, a higher RF voltage is applied to the third switch element than to the first switch element in the off-state. Thus, by setting the number of switch elements constituting the third switch element to be greater than the number of switch elements constituting the first switch element, it is possible to improve the withstand voltage characteristics of the third switch element, and to improve the electric power handling characteristics in the first filter.

The switch element may be an FET (Field Effect Transistor).

With the above feature, the on-resistance can be easily adjusted by adjusting a gate width.

The first switch element and the third switch element may be formed on one same semiconductor substrate.

In general, a switch element is constituted in the form of a package separate from that of a resonator and an impedance element. Thus, by forming both the first switch element and the third switch element on one same semiconductor substrate, still further size reduction can be realized in the entirety of the radio frequency front-end circuit.

The first filter may further include a second parallel arm resonator connected between the node and the ground, and a resonant frequency of the second parallel arm resonator may be different from a resonant frequency of the first parallel arm resonator, and an anti-resonant frequency of the second parallel arm resonator may be different from an anti-resonant frequency of the first parallel arm resonator.

With the above features, a frequency variable filter (tunable filter) capable of shifting a frequency of at least one of an attenuation pole on the lower frequency side of the pass band and an attenuation pole on the higher frequency side of the pass band depending on the switching between turning-on and turning-off of the third switch element can be realized as the first filter.

The second parallel arm resonator may be connected in parallel to a circuit including the first parallel arm resonator and the frequency varying circuit connected in series to each other, the resonant frequency of the second parallel arm resonator may be lower than the resonant frequency of the first parallel arm resonator, and the anti-resonant frequency of the second parallel arm resonator may be lower than the anti-resonant frequency of the first parallel arm resonator.

With the above features, a tunable filter capable of shifting the frequency of the attenuation pole on the higher frequency side of the pass band depending on the switching between the turning-on and the turning-off of the third switch element while suppressing an increase of the insertion loss at a higher frequency side end of the pass band can be realized as the first filter.

The second parallel arm resonator may be connected in parallel to a circuit including the first parallel arm resonator and the frequency varying circuit connected in series to each other, the resonant frequency of the second parallel arm resonator may be higher than the resonant frequency of the first parallel arm resonator, and the anti-resonant frequency of the second parallel arm resonator may be higher than the anti-resonant frequency of the first parallel arm resonator.

With the above features, a tunable filter capable of shifting the frequency of the attenuation pole on the lower frequency side of the pass band depending on the switching between the turning-on and the turning-off of the third switch element while suppressing an increase of the insertion loss at a lower frequency side end of the pass band can be realized as the first filter.

The first parallel arm resonator and the second parallel arm resonator may be connected in parallel to each other, and the frequency varying circuit may be connected in series to a circuit including the first parallel arm resonator and the second parallel arm resonator connected in parallel to each other.

With the above features, a tunable filter capable of shifting the frequencies of the attenuation poles on both the sides of the pass band depending on the switching between the turning-on and the turning-off of the third switch element can be realized as the first filter.

The first filter may further include another frequency varying circuit that is connected in series to the second parallel arm resonator between the node and the ground, and the circuit including the first parallel arm resonator and the frequency varying circuit connected in series to each other may be connected in parallel to a circuit including the second parallel arm resonator and the other frequency varying circuit connected in series to each other.

With the above features, the first filter can shift the frequencies of the attenuation poles on the higher frequency side and the lower frequency side of the pass band depending on the switching between the turning-on and the turning-off of the third switch element, and can suppress an increase of the insertion loss at the higher frequency side end and the lower frequency side end of the pass band. Therefore, a tunable filter capable of shifting a center frequency while maintaining a band width, for example, can be realized.

The first impedance element may be one of an inductor element and a capacitor element, the frequency varying circuit may further include a second impedance element that is the other of the inductor element and the capacitor element, and that is connected in series to the third switch element, and the third switch element may be connected in parallel to the first impedance element via the second impedance element.

With the above features, the first filter can shift the frequency of the attenuation pole on the lower frequency side of the pass band over a wide range depending on the switching between the turning-on and the turning-off of the third switch element.

The first impedance element may be a third parallel arm resonator having a resonant frequency higher than a resonant frequency of the first parallel arm resonator and an anti-resonant frequency higher than an anti-resonant frequency of the first parallel arm resonator.

With the above feature, a tunable filter capable of shifting the frequency of the attenuation pole on the lower frequency side of the pass band and changing the number of attenuation poles on the higher frequency side of the pass band depending on the switching between the turning-on and the turning-off of the third switch element can be realized as the first filter.

A communication device according to an embodiment of the present invention includes a radio frequency integrated circuit that processes radio frequency signals transmitted from and received by an antenna element, and the above-described radio frequency front-end circuit that transfers the radio frequency signals between the antenna element and the radio frequency integrated circuit.

With the above feature, the communication device capable of reducing not only the size, but also the loss in the pass band can be obtained.

With the radio frequency front-end circuit and the communication device according to the present invention, the size reduction can be realized and the loss in the pass band can be suppressed concurrently.

Figure 3A:
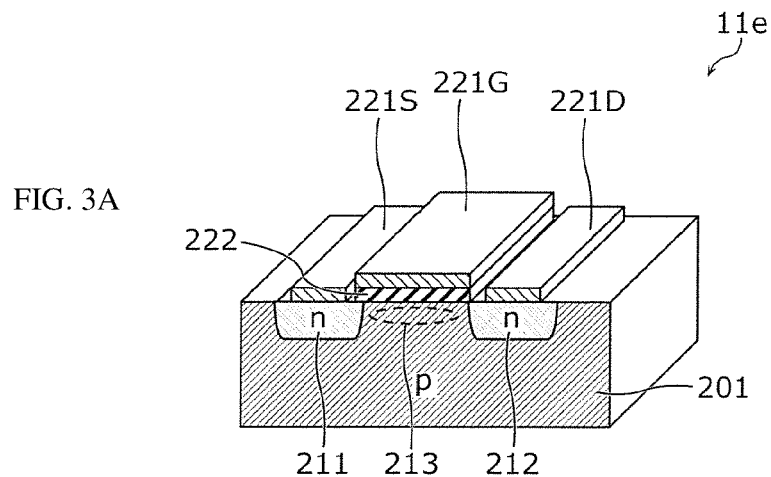
Figure 3B:
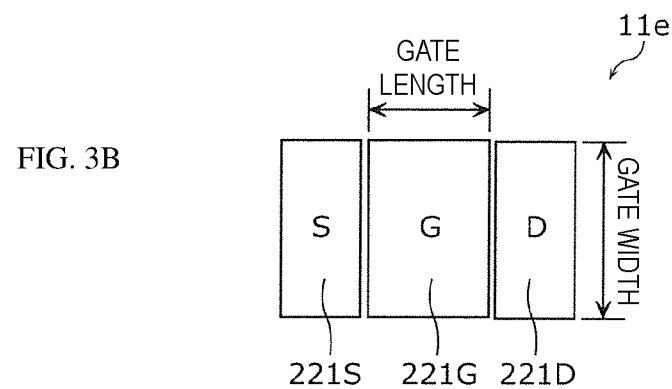

Each of FIGS. 3A and 3B schematically illustrates a structure of an element constituting an FET according to Embodiment 1.

Figure 3C:
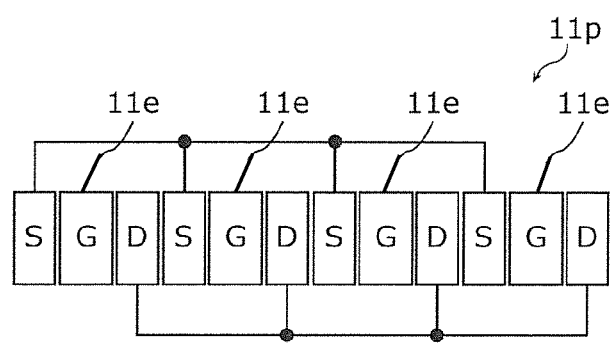

FIG. 3C is a plan view schematically illustrating a configuration of the FET according to Embodiment 1.

Figure 2A:
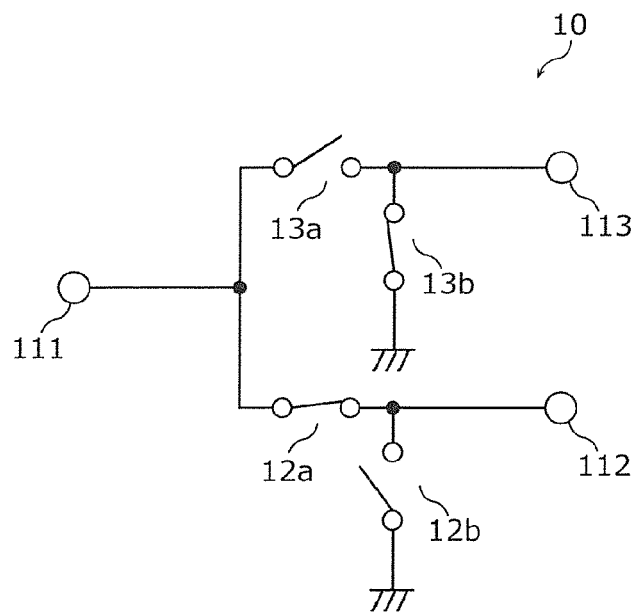
FIG. 2A is a circuit diagram of a switching circuit according to Embodiment 1.
Figure 2B:
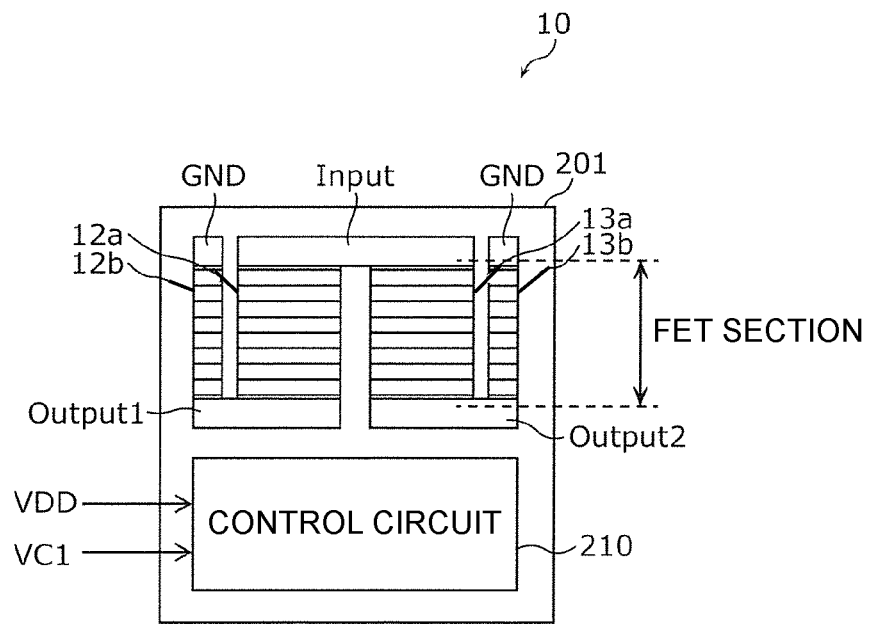
FIG. 2B is a plan view schematically illustrating a semiconductor substrate of a switch IC that constitutes the switching circuit according to Embodiment 1, which is illustrated in FIG. 2A.
Figure 3D:
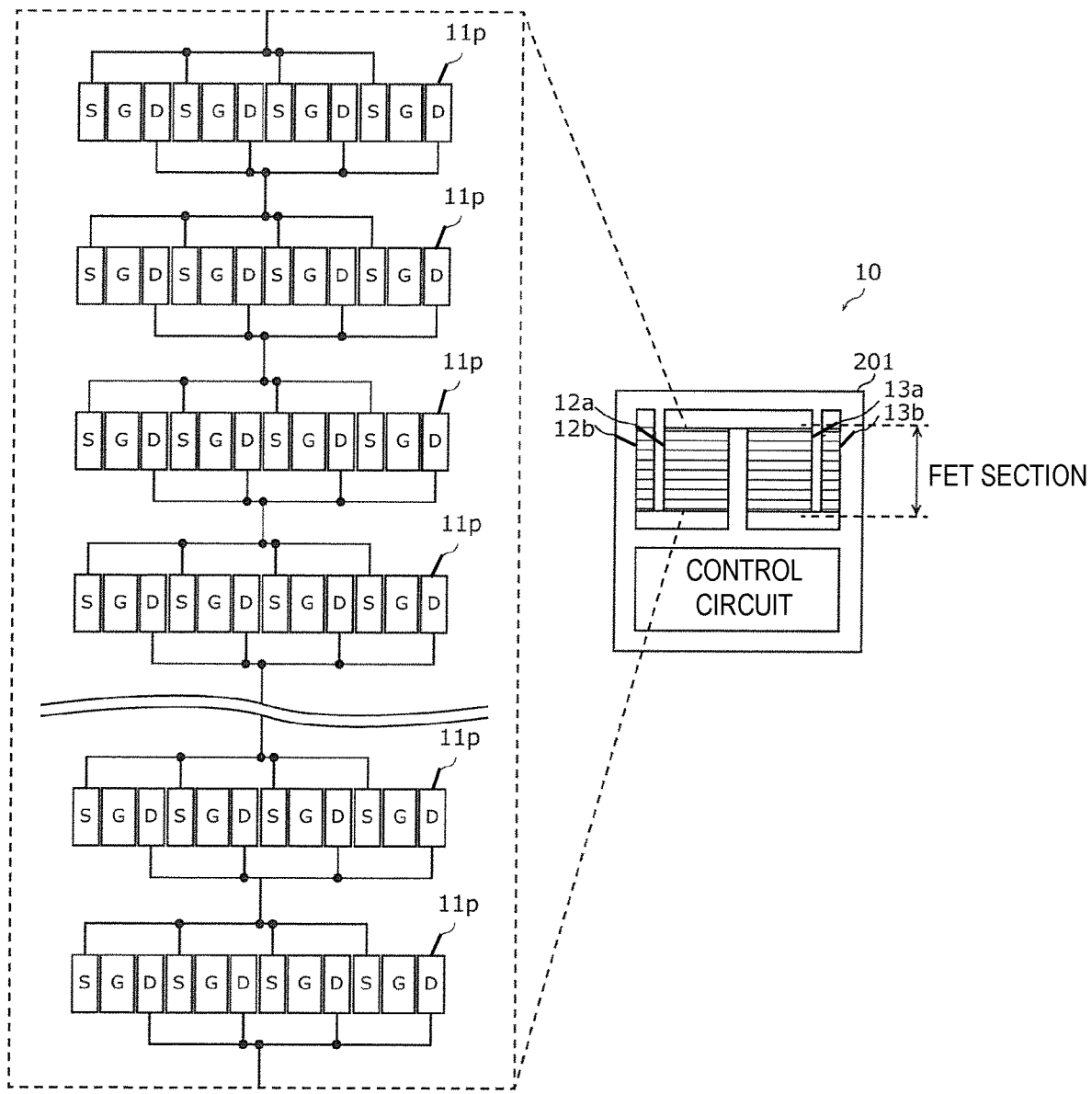

FIG. 3D is a plan view schematically illustrating, in an enlarged scale, a configuration of a switch in the semiconductor substrate according to Embodiment 1, which is illustrated in FIG. 2B.

Figure 4:
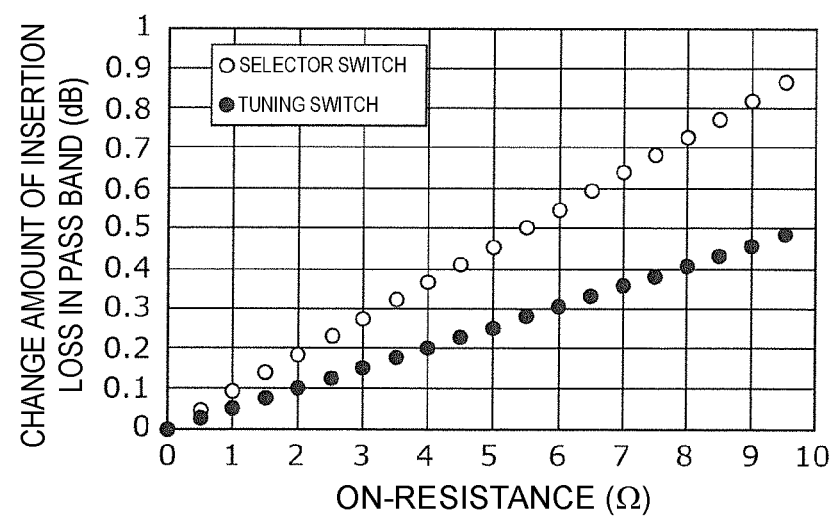

FIG. 4 is a graph depicting a change amount of insertion loss in a pass band relative to an on-resistance in Embodiment 1.

Figure 5:
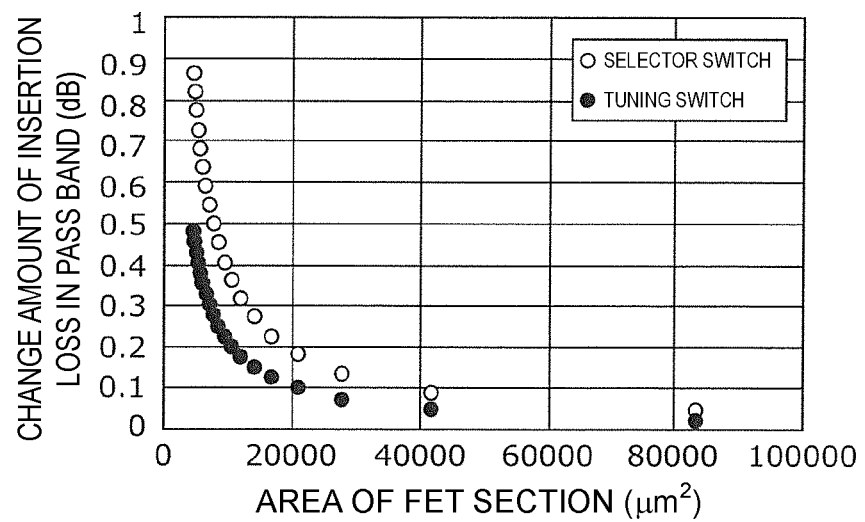

FIG. 5 is a graph depicting a change amount of the insertion loss in the pass band relative to an area of a FET section in Embodiment 1.

Figure 6A:
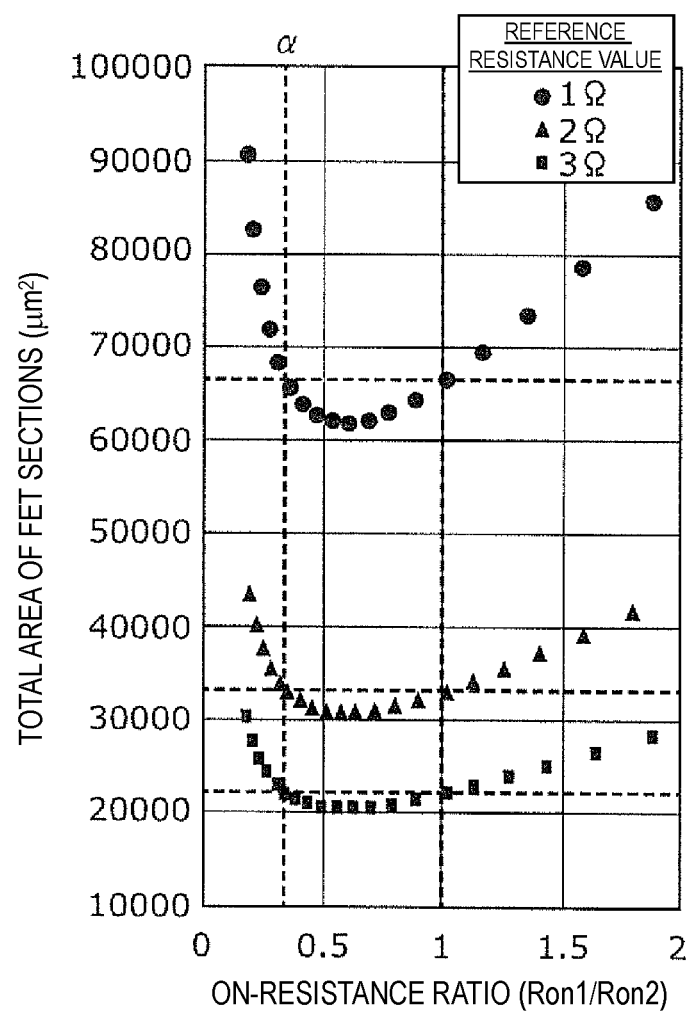

FIG. 6A is a graph depicting a relation of a total area of the FET sections relative to an on-resistance ratio when the insertion loss in the pass band is held constant.

Figure 6B:
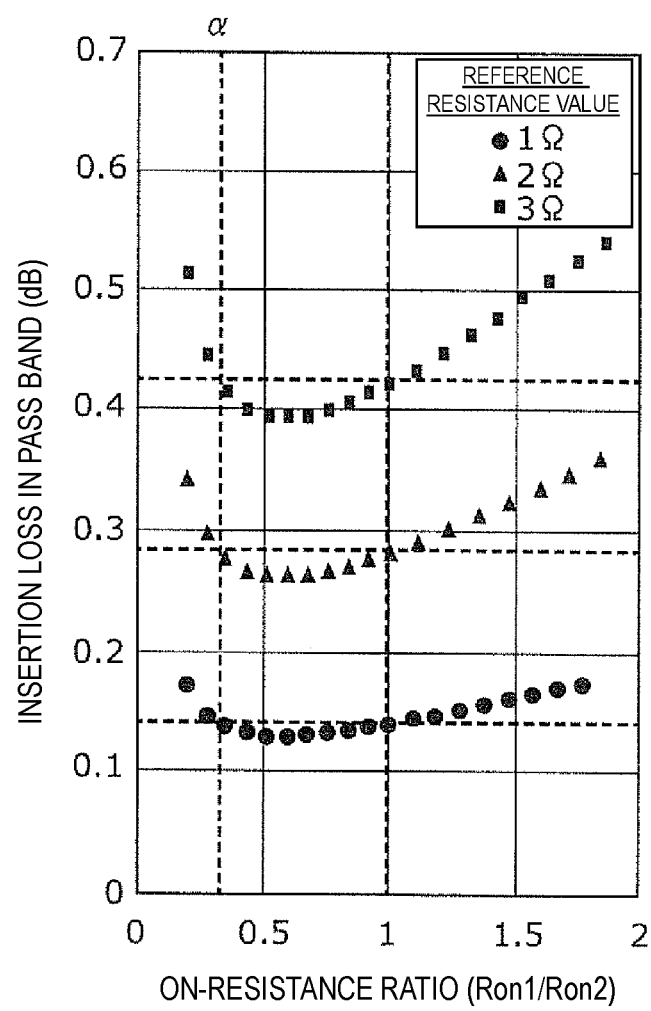

FIG. 6B is a graph depicting a relation of the insertion loss in the pass band relative to the on-resistance ratio when the total area of the FET sections is held constant.

Figure 7A:
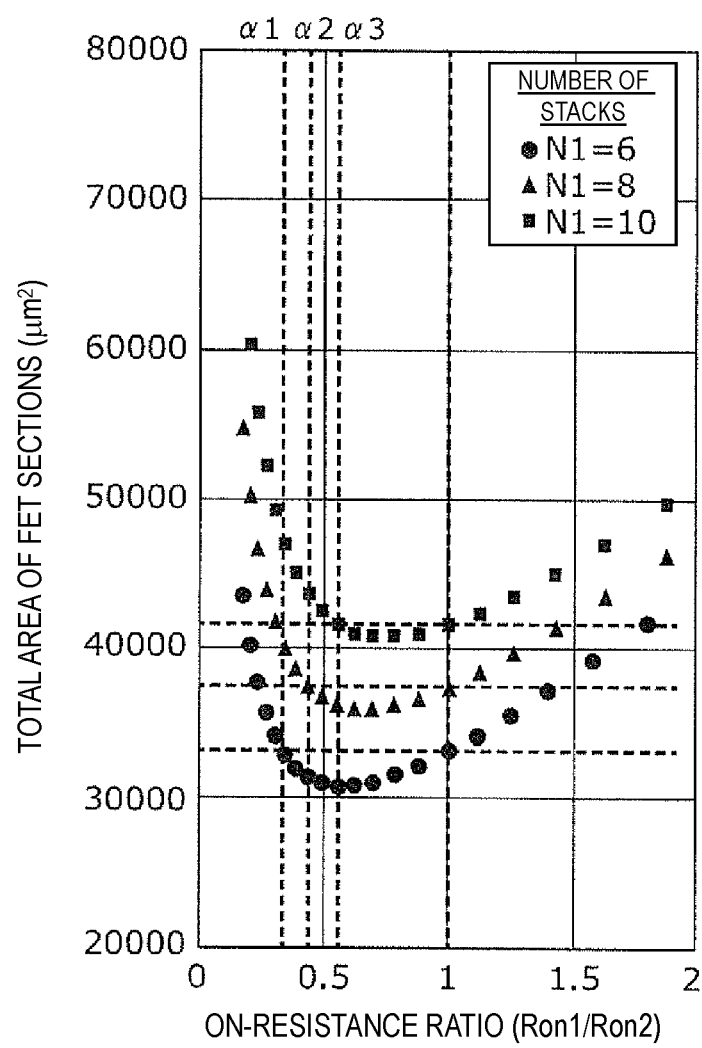

FIG. 7A is a graph depicting a relation between the on-resistance ratio and the total area of the FET sections when the number of stacks is changed.

Figure 7B:
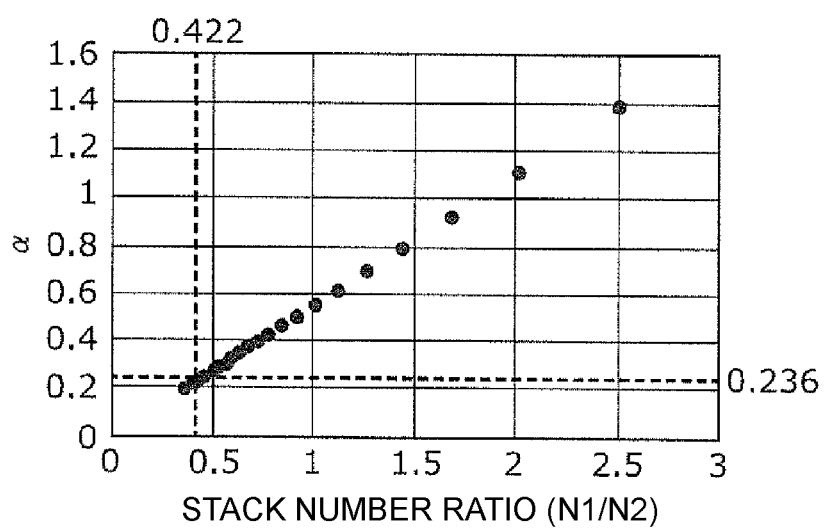

FIG. 7B is a graph depicting a relation between a stack number ratio and a.

Figure 8A:
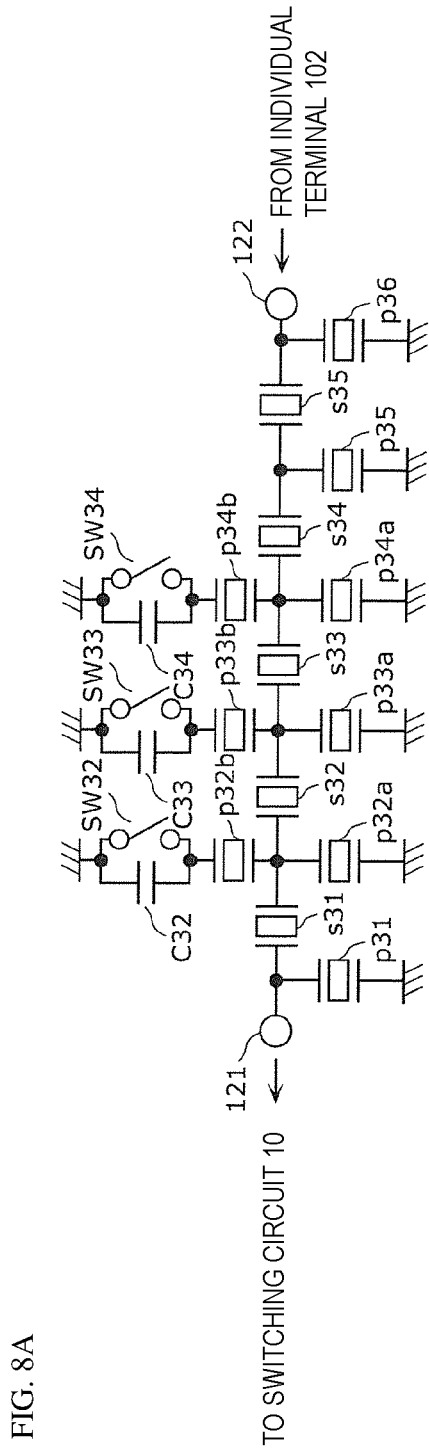

FIG. 8A is a circuit diagram of a filter according to Examples.

Figure 8B:
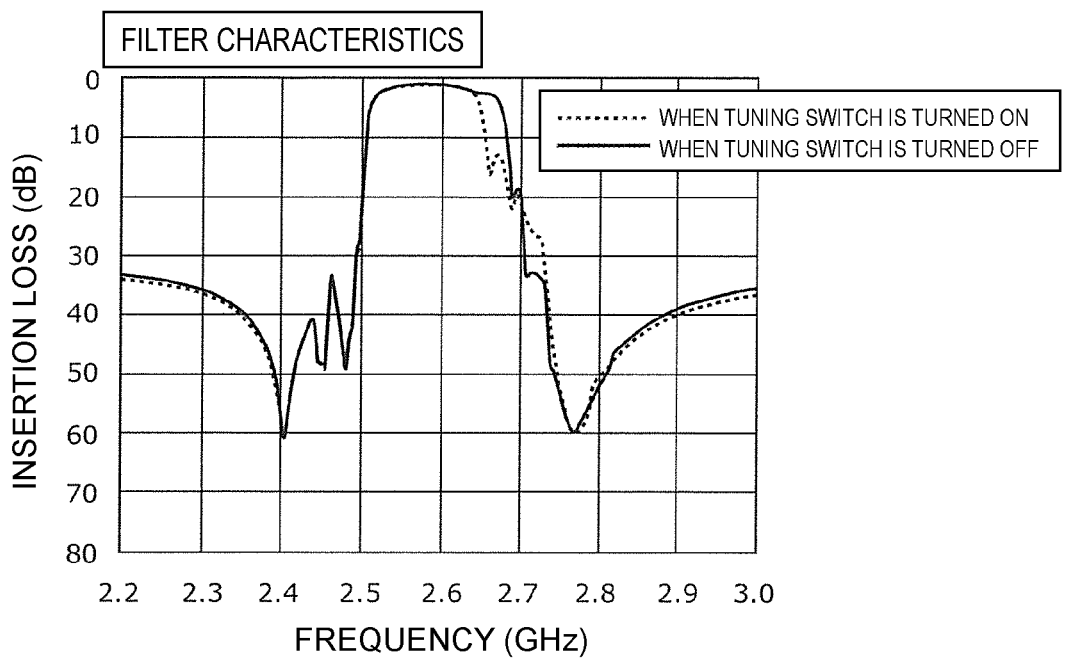

FIG. 8B is a graph depicting filter characteristics of the filter according to Examples.

Figure 8C:
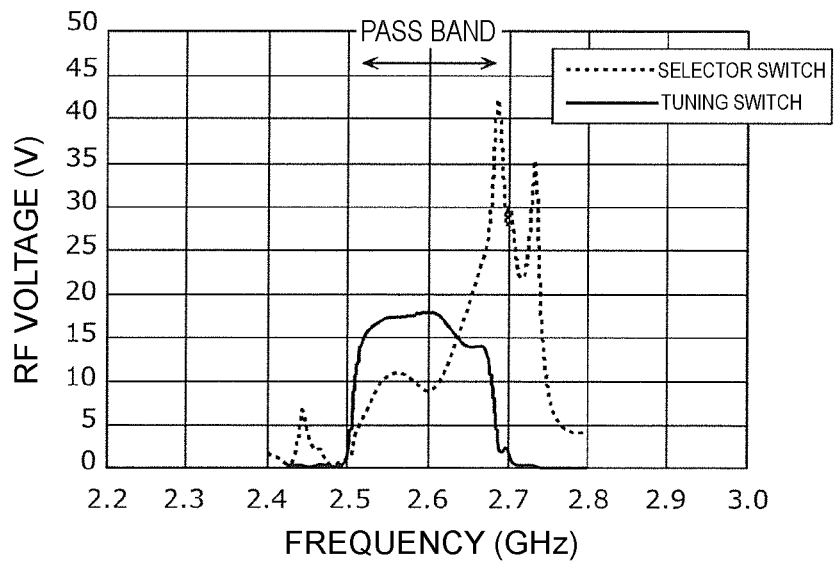

FIG. 8C is a graph comparatively depicting an RF voltage applied to a switch of a frequency varying circuit, which is subjected to a maximum voltage in an off-state, and an RF voltage applied to a switch of the switching circuit in an off-state.

Figure 9:
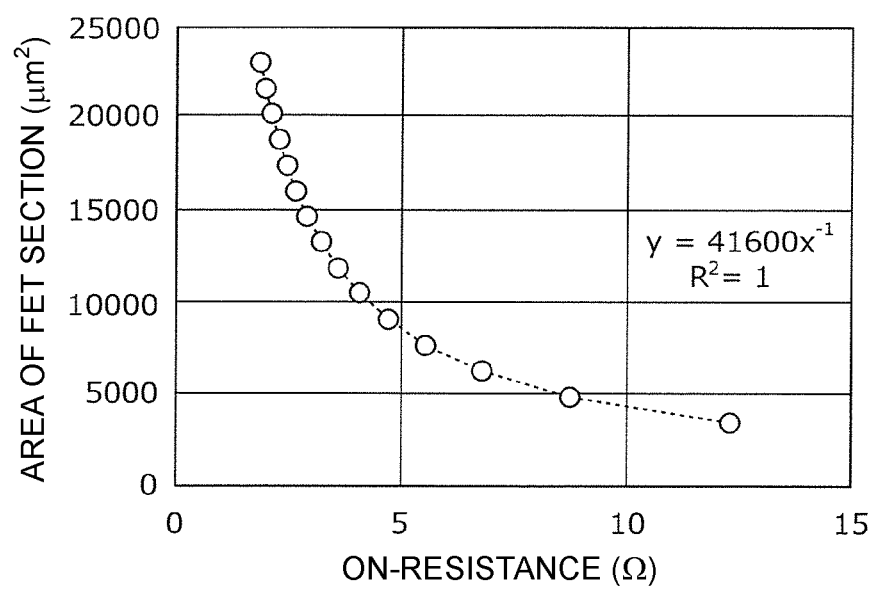

FIG. 9 is a graph depicting a relation of the area of the FET section relative to the on-resistance.

Figure 10A:
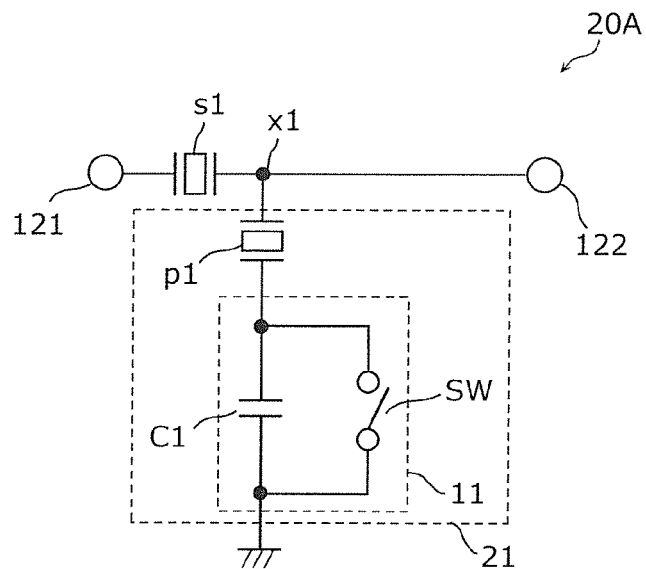

FIG. 10A is a circuit diagram of a filter according to Configuration Example 1 of Embodiment 1.

Figure 10B:
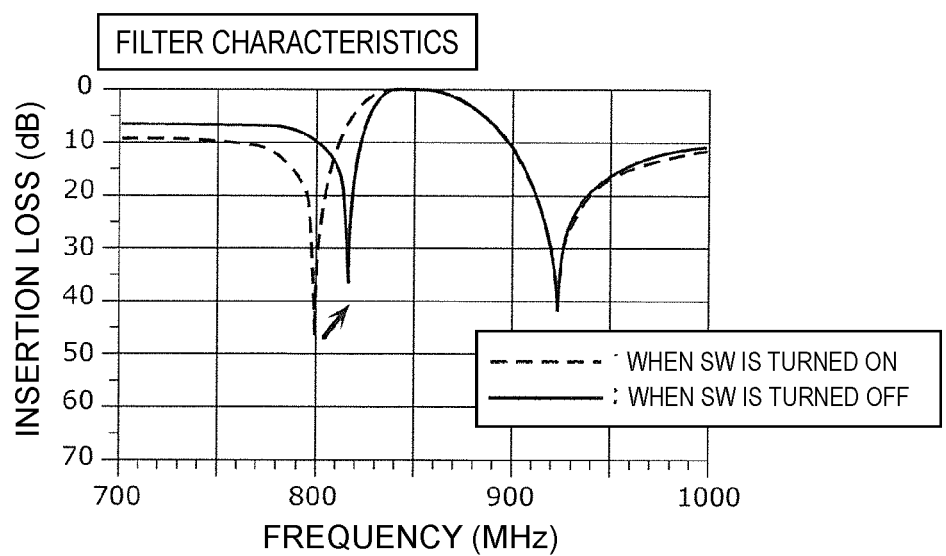

FIG. 10B is a graph depicting filter characteristics of the filter according to Configuration Example 1 of Embodiment 1.

Figure 11A:
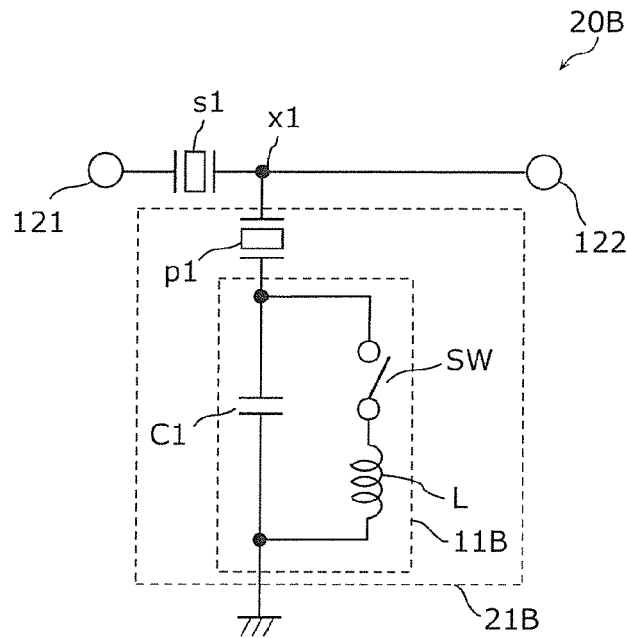

FIG. 11A is a circuit diagram of a filter according to Configuration Example 2 of Embodiment 1.

Figure 11B:
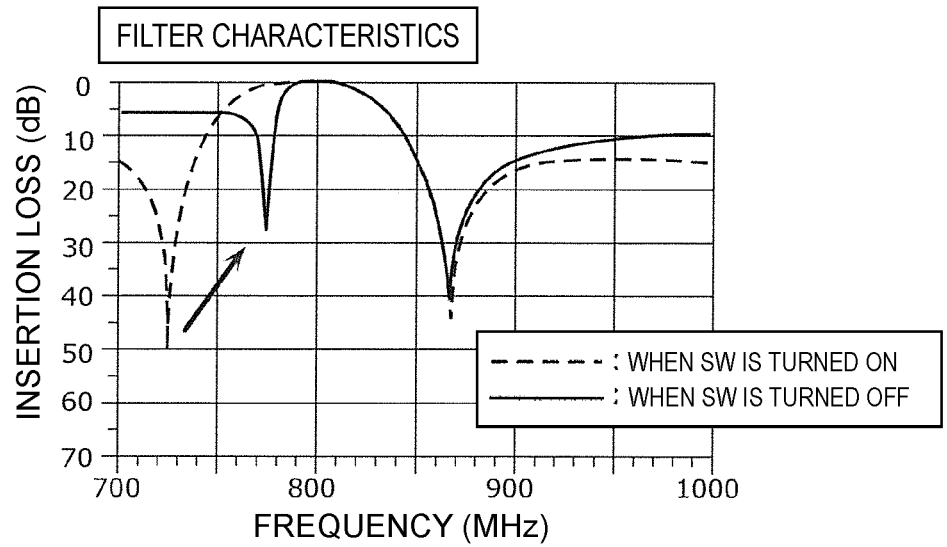

FIG. 11B is a graph depicting filter characteristics of the filter according to Configuration Example 2 of Embodiment 1.

Figure 12A:
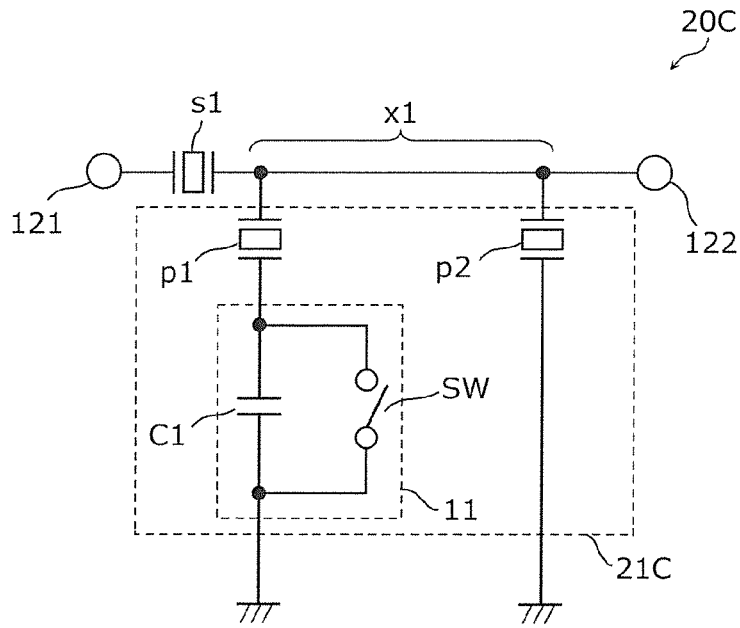

FIG. 12A is a circuit diagram of a filter according to Configuration Example 3 of Embodiment 1.

Figure 12B:
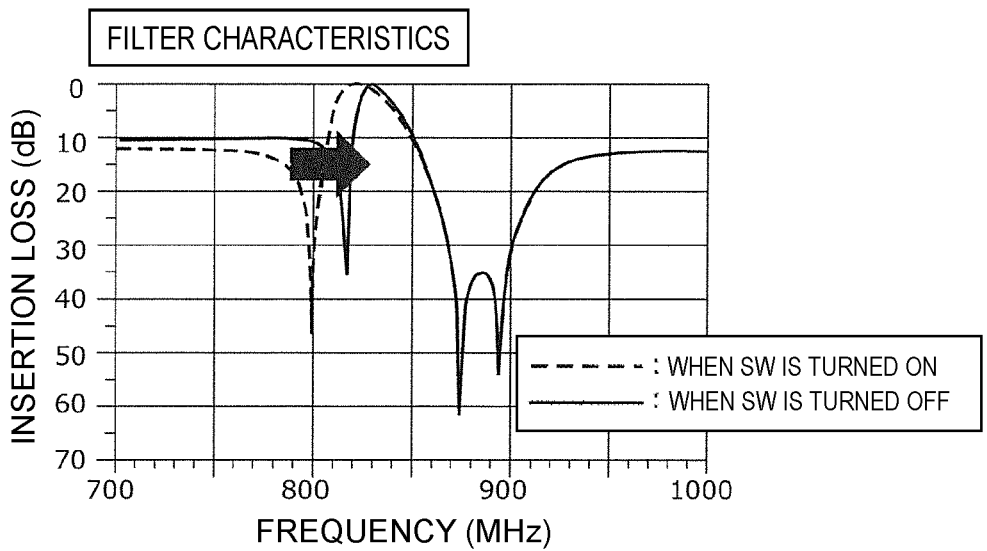

FIG. 12B is a graph depicting filter characteristics of the filter according to Configuration Example 3 of Embodiment 1.

Figure 13A:
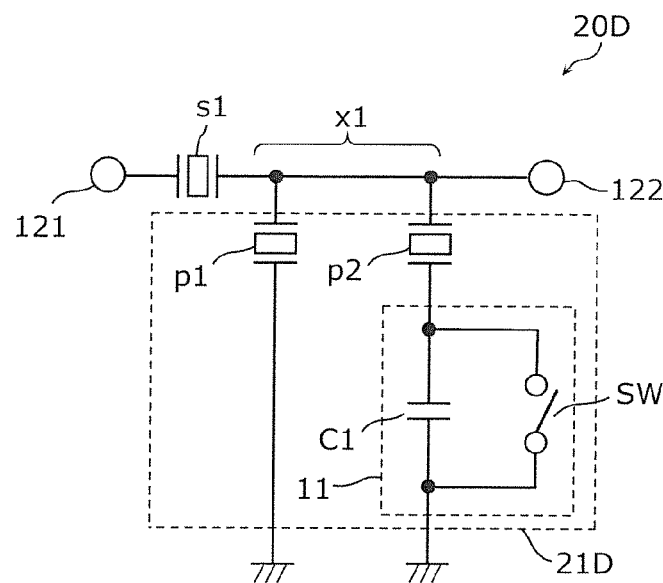

FIG. 13A is a circuit diagram of a filter according to Configuration Example 4 of Embodiment 1.

Figure 13B:
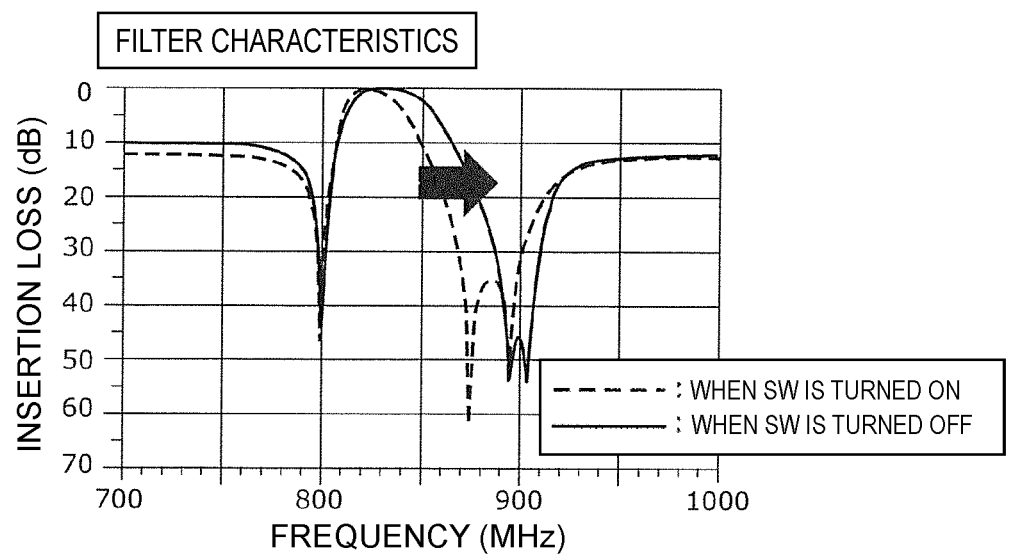

FIG. 13B is a graph depicting filter characteristics of the filter according to Configuration Example 4 of Embodiment 1.

Figure 14A:
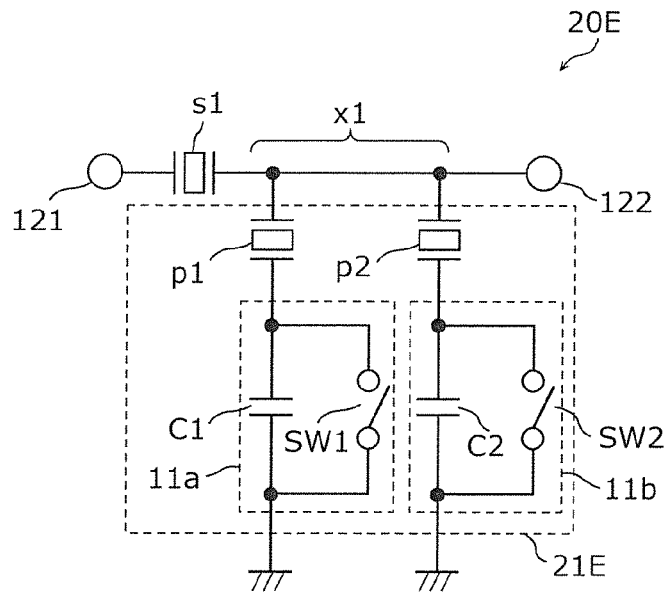

FIG. 14A is a circuit diagram of a filter according to Configuration Example 5 of Embodiment 1.

Figure 14B:
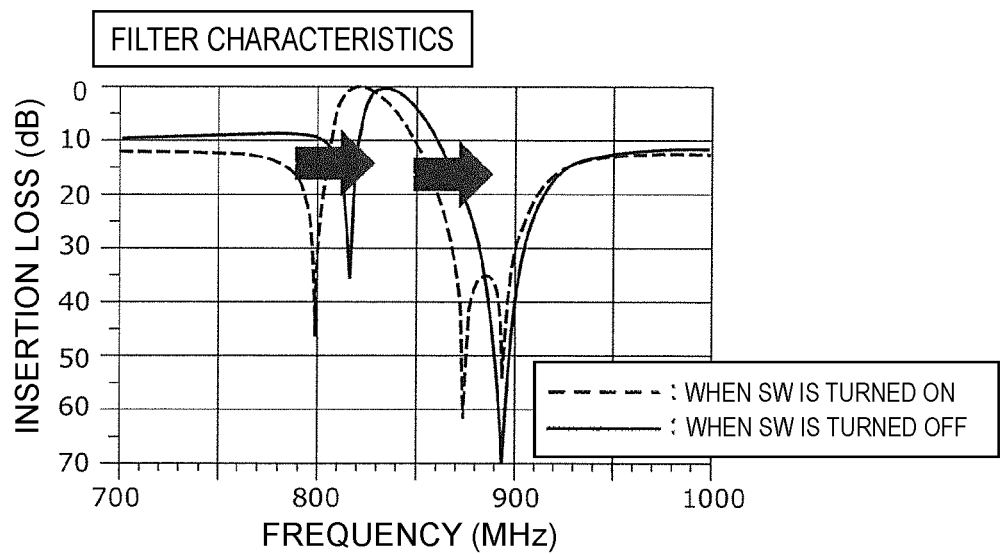

FIG. 14B is a graph depicting filter characteristics of the filter according to Configuration Example 5 of Embodiment 1.

Figure 15A:
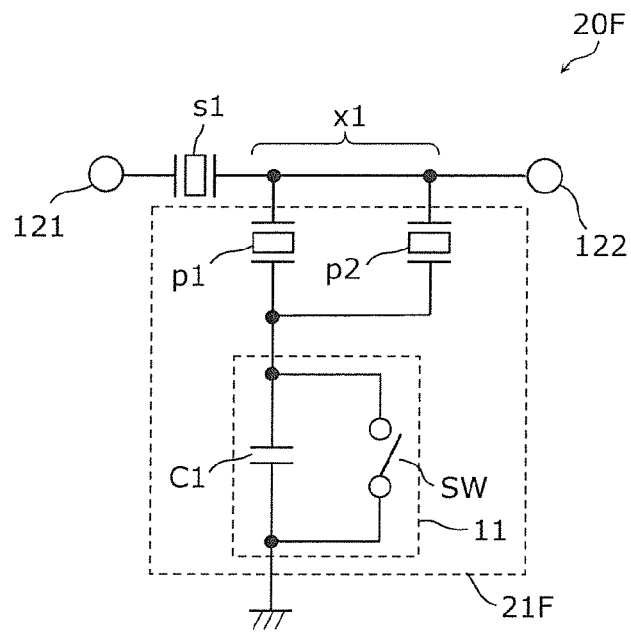

FIG. 15A is a circuit diagram of a filter according to Configuration Example 6 of Embodiment 1.

Figure 15B:
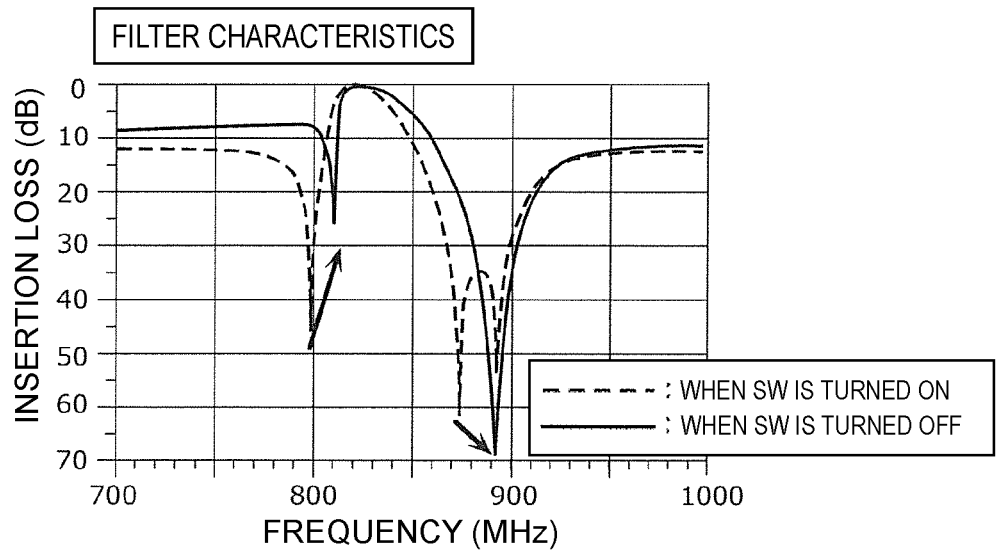

FIG. 15B is a graph depicting filter characteristics of the filter according to Configuration Example 6 of Embodiment 1.

Figure 16A:
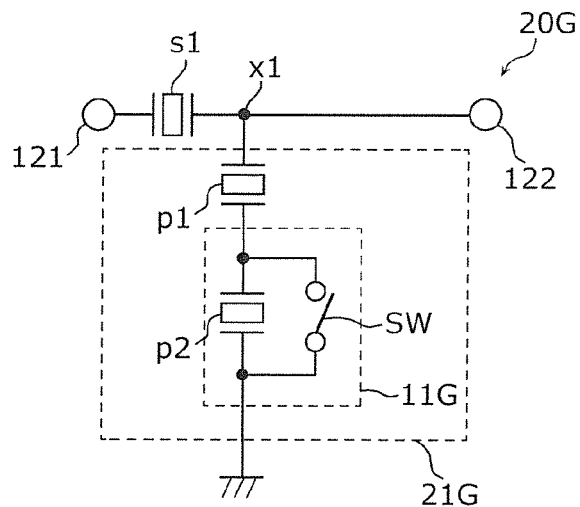

FIG. 16A is a circuit diagram of a filter according to Configuration Example 7 of Embodiment 1.

Figure 16B:
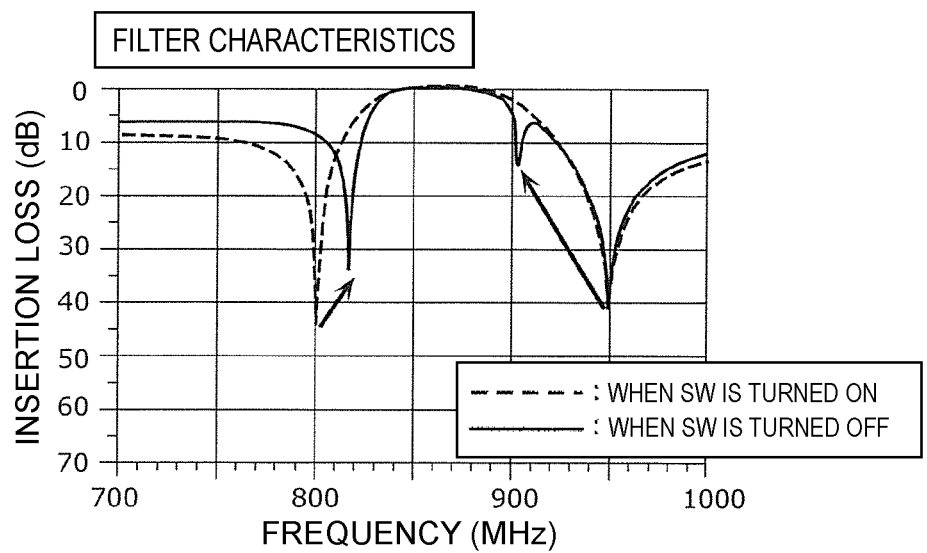

FIG. 16B is a graph depicting filter characteristics of the filter according to Configuration Example 7 of Embodiment 1.

Figure 17A:
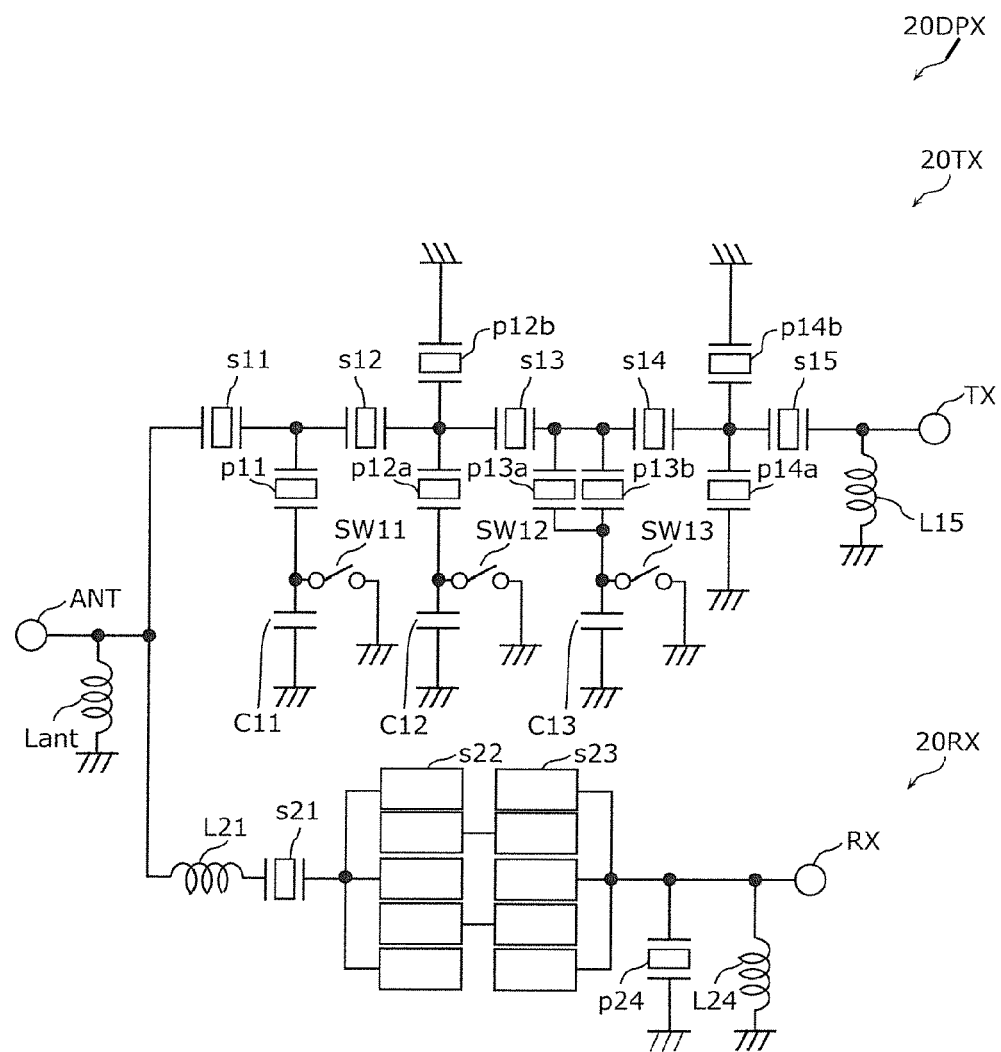

FIG. 17A is a circuit diagram of a duplexer according to Embodiment 2.

Figure 17B:
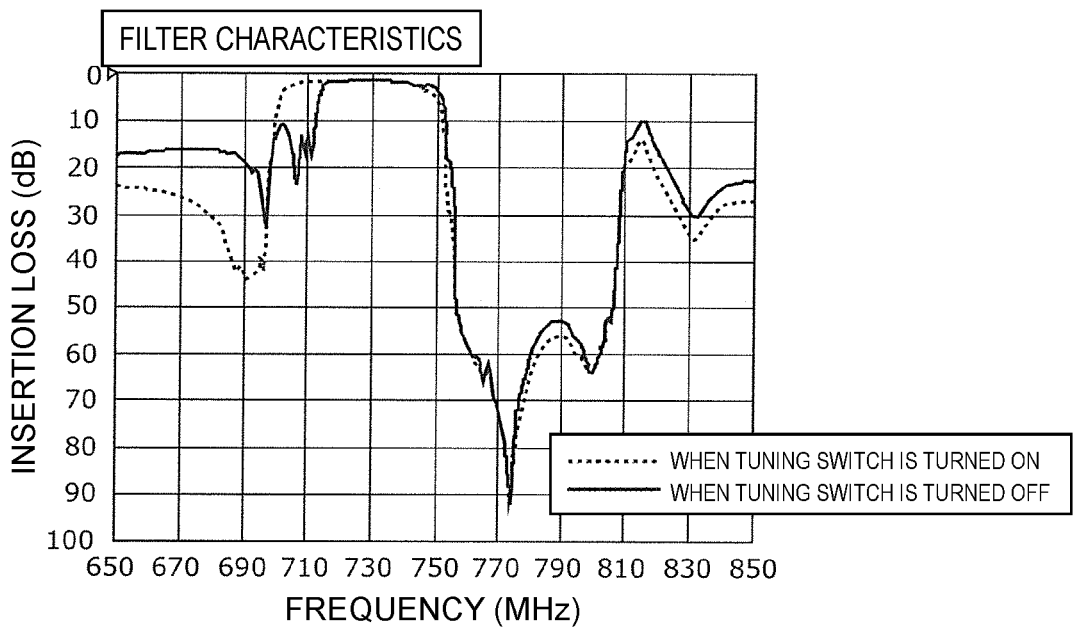

FIG. 17B is a graph depicting filter characteristics of a transmit filter in the duplexer according to Embodiment 2.

Figure 17C:
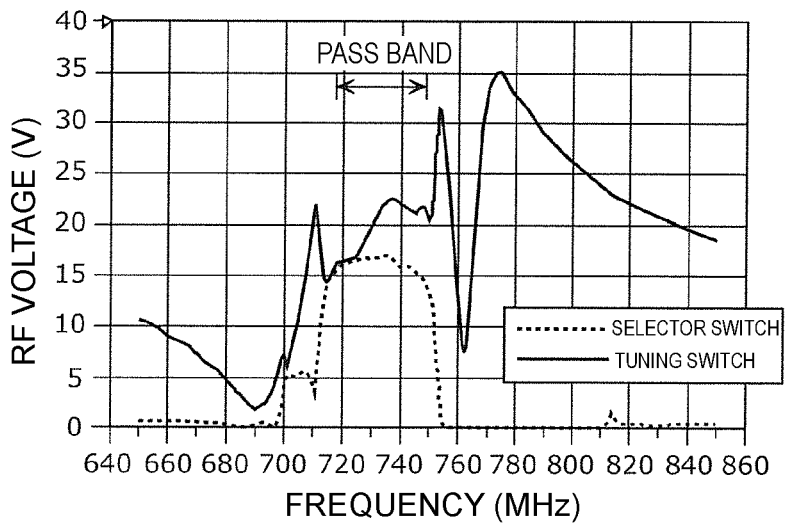

FIG. 17C is a graph comparatively depicting an RF voltage applied to a switch of a frequency varying circuit, which is subjected to a maximum voltage in an off-state, and an RF voltage applied to a switch of the switching circuit in an off-state in Embodiment 2.

Figure 18A:
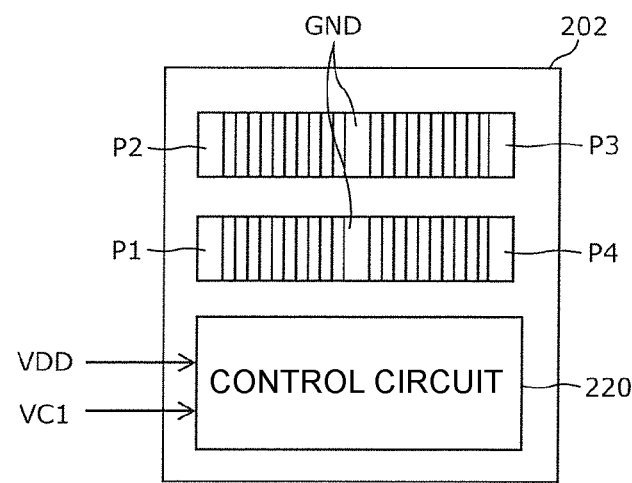

FIG. 18A is a plan view schematically illustrating a semiconductor substrate on or in which switches of a plurality of frequency varying circuits are formed in Embodiment 2.

Figure 18B:
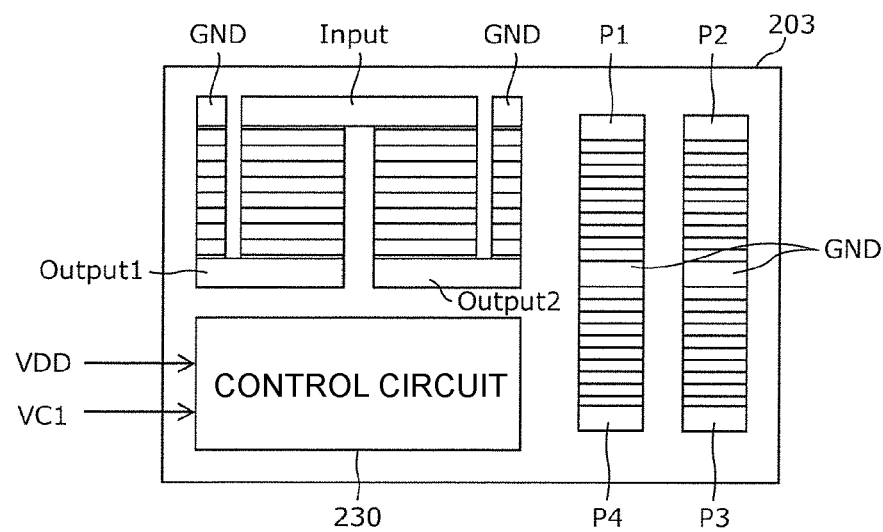

FIG. 18B is a plan view schematically illustrating a semiconductor substrate on or in which switches of the switching circuit and the switches of the frequency varying circuits are both formed in Embodiment 2.

Figure 19:
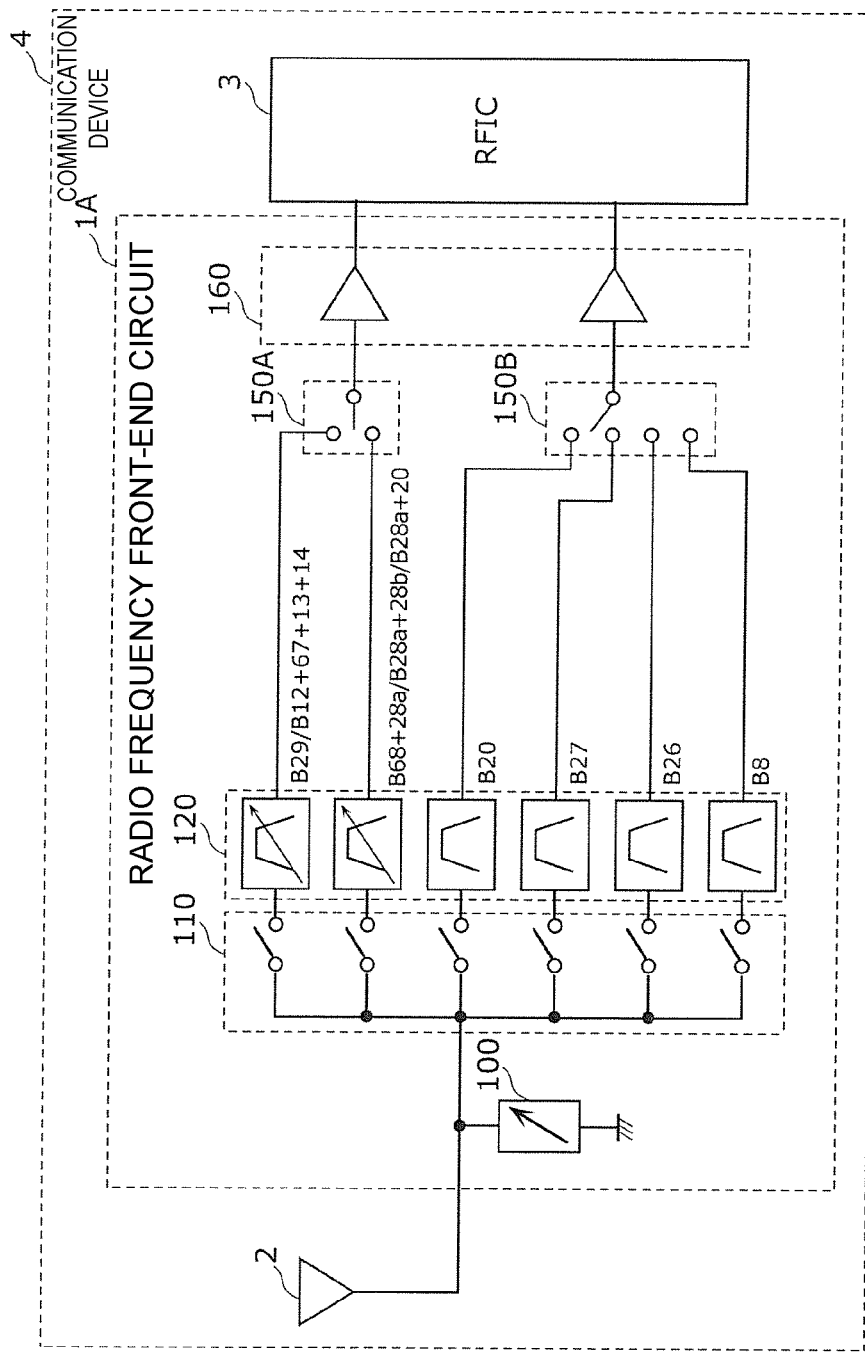

FIG. 19 is a block diagram of a radio frequency front-end circuit according to Embodiment 3 and peripheral circuits thereof.

DETAILED DESCRIPTION OF THE DISCLOSURE

Embodiments of the present invention will be described in detail below with reference to examples and drawings. It is to be noted that any of the following embodiments represents a generic or specific example. Numerical values, shapes, materials, constituent elements, arrangements and connection forms of the constituent elements, etc., which are described in the following embodiments, are merely illustrative, and they are not purported to limit the scope of the present invention. Among the constituent elements in the following embodiments, those ones not stated in independent Claims are explained as optional constituent elements. Sizes or relative size ratios of the constituent elements illustrated in the drawings are not always exactly true in a strict sense. In the drawings, substantially the same constituent elements are denoted by the same reference signs, and duplicate description of those constituent elements is omitted or simplified in some cases.

In the following description, the term "lower-frequency end of a pass band" stands for a "lowest frequency within the pass band". The term "higher-frequency end of a pass band" stands for a "highest frequency within the pass band". In the following description, the term "lower-frequency side of a pass band" stands for the "outside of the pass band on the lower frequency side than the pass band". The term "higher-frequency side of a pass band" stands for the "outside of the pass band on the higher frequency side than the pass band".

Embodiment 1

1. Configuration

1-1. Overall Configuration

Figure 1:
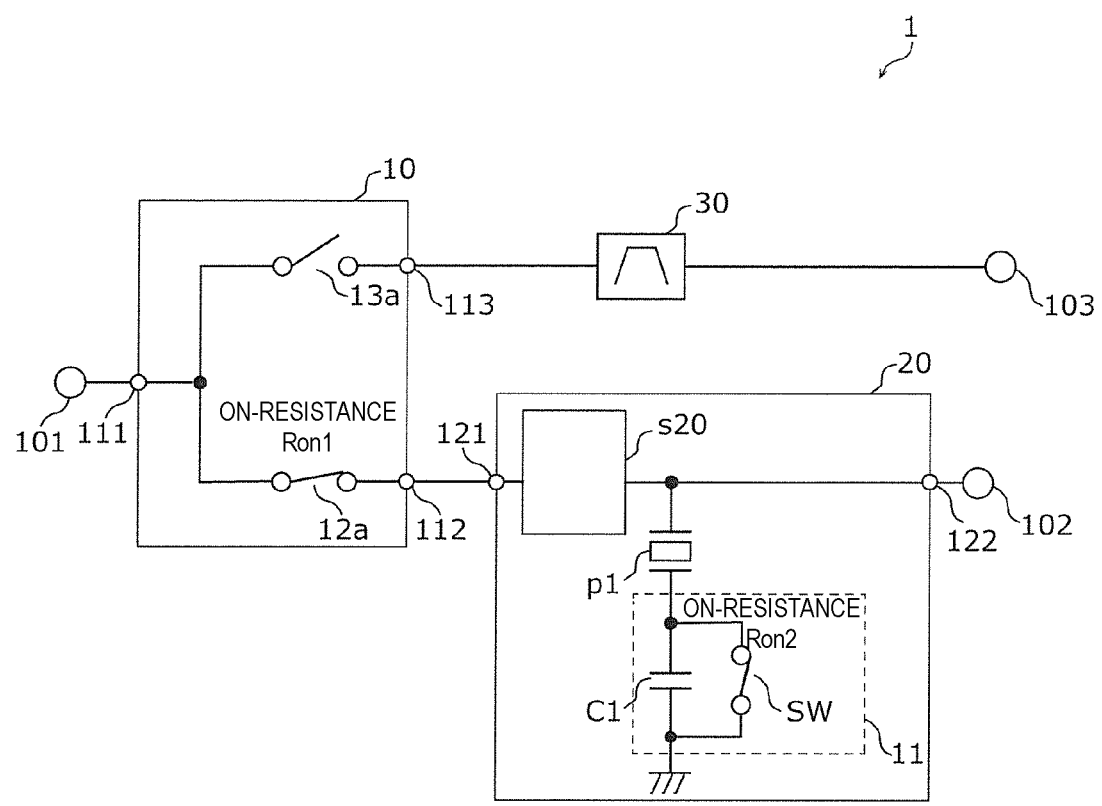
FIG. 1 is a block diagram of a radio frequency front-end circuit according to Embodiment 1.

FIG. 1 is a block diagram of a radio frequency front-end circuit 1 according to Embodiment 1.

The radio frequency front-end circuit 1 is a circuit for transferring a radio frequency signal among an antenna element (not illustrated), an amplifier (not illustrated), and an RFIC (not illustrated). The antenna element, the amplifier, and the RFIC are disposed outside the radio frequency front-end circuit 1. The amplifier may be built in the radio frequency front-end circuit 1.

More specifically, the radio frequency front-end circuit 1 includes a switching circuit 10 and a plurality of filters (two filters 20 and 30 in this embodiment). In the radio frequency front-end circuit 1, the switching circuit 10 switches over a transfer path of the radio frequency signal to one of paths passing the filters. Here, the filter 20 is an example of a first filter, and the filter 30 is an example of the second filter.

The radio frequency front-end circuit 1 allows a radio frequency signal in a predetermined frequency band among radio frequency signals (here, radio frequency received signals), which have been received by the antenna element and inputted to the antenna terminal 101, to pass therethrough, and outputs the radio frequency signal to the RFIC through the amplifier from one among a plurality of individual terminals (two individual terminals 102 and 103 in this embodiment). Conversely, the radio frequency front-end circuit 1 amplifies radio frequency signals (here, radio frequency transmit signals) inputted to the individual terminals from the RFIC, allows the radio frequency signal in a predetermined frequency band to pass therethrough, and outputs it to the antenna element from the antenna terminal 101.

The switching circuit 10 is a switch circuit having a common terminal 111 and a plurality of select terminals (two select terminals 112 and 113 in this embodiment) that are selectively connected to the common terminal 111. The common terminal 111 is connected to the antenna terminal 101 of the radio frequency front-end circuit 1, and the select terminals are individually connected to the individual terminals of the radio frequency front-end circuit 1 through the filters.

In this embodiment, the switching circuit 10 includes an SPST (Single-Pole, Single-Throw) switch 12a (first switch element) that switches over conduction and non-conduction between the common terminal 111 and the select terminal 112 (first select terminal). The switching circuit 10 further includes an SPST (Single-Pole, Single-Throw) switch 13a (second switch element) that switches over conduction and non-conduction between the common terminal 111 and the select terminal 113 (second select terminal). The switches 12a and 13a are turned on (into a conduction state) and turned off (into a non-conduction state) in accordance with a control signal from a control unit (not illustrated) such as the RFIC. As a result, the common terminal 111 is selectively connected to the select terminals 112 and 113. A detailed configuration of the switching circuit 10 will be described later.

The filter 20 is a frequency variable filter connected to the select terminal 112 (first select terminal). More specifically, the filter 20 includes a serial arm resonance circuit s20, a parallel arm resonator p1 (first parallel arm resonator), and a frequency varying circuit 11 that varies a frequency (here, a frequency of an attenuation pole) of the filter 20.

Here, the serial arm resonance circuit s20 is connected to a path connecting an input/output terminal 121 (first input/output terminal), which is connected to the select terminal 112, to an input/output terminal 122 (second input/output terminal). An acoustic wave resonator is constituted by a resonator using, for example, a surface acoustic wave, a bulk wave, or a boundary acoustic wave. The parallel arm resonator p1 is constituted by one or more acoustic wave resonators, for example, and is connected between a node on the path connecting the input/output terminal 121 to the input/output terminal 122 and a ground. The frequency varying circuit 11 is a circuit including a capacitor (first impedance element) and a switch SW (third switch element) in the form of an SPST switch, the capacitor and the switch SW being connected in parallel to each other. The frequency varying circuit 11 is connected in series to the parallel arm resonator p1 between the node and the ground.

Because of including the frequency varying circuit 11 connected in series to the parallel arm resonator p11, the above-described filter 20 can shift (vary) a resonant frequency in the combined characteristics of the parallel arm resonator p1 and the frequency varying circuit 11 depending on switching between the conduction and the non-conduction of the switch SW. Thus, according to the filter 20, since a frequency difference between the resonant frequency and the anti-resonant frequency is variable in the combined characteristics depending on the switching between the conduction and the non-conduction of the switch SW, the frequency of the attenuation pole, specified by the resonant frequency of the combined characteristics, can be varied. A variety of configurations can be optionally applied to the filter 20, and details of those configurations will be described later as Configuration Examples.

Here, the term "resonant frequency of an acoustic wave resonator" stands for a frequency at a "resonance point", i.e., a peculiar point at which impedance of the acoustic wave resonator is locally minimized (ideally, a point at which the impedance becomes 0). The term "anti-resonant frequency of an acoustic wave resonator" stands for a frequency at an "anti-resonance point", i.e., a peculiar point at which impedance of the acoustic wave resonator is locally maximized (ideally, a point at which the impedance becomes infinite). In the present specification, with respect to not only a single acoustic wave resonator, but also a circuit constituted by a plurality of acoustic wave resonators or impedance elements, a peculiar point at which the impedance is locally minimized (ideally, a point at which the impedance becomes 0) is called a "resonance point", and a frequency at the resonance point is called a "resonant frequency" for convenience of explanation. Furthermore, a peculiar point at which the impedance is locally maximized (ideally, a point at which the impedance becomes infinite) is called an "anti-resonance point", and a frequency at the anti-resonance point is called an "anti-resonant frequency".

A resonance circuit having a resonant frequency and an anti-resonant frequency, such as an LC resonance circuit, may be disposed instead of the acoustic wave resonator.

The filter 30 is connected to the select terminal 113 (second select terminal), and it is a frequency-fixed acoustic wave filter in this embodiment. The configuration of the filter 30 is not limited to a particular one, and the filter 30 may be a frequency variable filter as with the filter 20. Moreover, the filter 30 is not limited to the acoustic wave filter constituted by one or more acoustic wave resonators, and it may be an LC filter or a dielectric filter.

The radio frequency front-end circuit 1 having the above-described configuration operates as follows in accordance with the control signal from the control unit (not illustrated) such as the RFIC.

In the switching circuit 10, the common terminal 111 is connected to one or more of the select terminals 112 and 113. More specifically, when the common terminal 111 and the select terminal 112 are connected to each other with turning-on of the switch 12a, the radio frequency front-end circuit 1 selects the filter 20 (first filter) between the filters 20 and 30. When the common terminal 111 and the select terminal 113 are connected to each other with turning-on of the switch 13a, the radio frequency front-end circuit 1 selects the filter 30 (second filter) between the filters 20 and 30. Then, the radio frequency front-end circuit 1 transfers the radio frequency signal, which is to be transferred between the antenna element (not illustrated) and the RFIC (not illustrated), through the selected filter 20 or 30.

The frequency varying circuit 11 in the filter 20 shifts the frequency of at least one attenuation pole of the filter 20 depending on the switching between the turning-on (conduction) and the turning-off (non-conduction) of the switch SW. In other words, the filter 20 varies the frequencies of the attenuation pole, the pass band, etc. depending on the switching between the turning-on and the turning-off of the switch SW.

As described above, the radio frequency front-end circuit 1 transfers the radio frequency signal, which is to be transferred between the antenna element (not illustrated) and the RFIC (not illustrated), through the frequency variable filter 20 or the frequency fixed filter 30. When the filter 20 is selected by turning on the switch 12a (first switch) of the switching circuit 10, the radio frequency front-end circuit 1 transfers the radio frequency signal between the antenna element and the RFIC as follows. The radio frequency front-end circuit 1 allows the radio frequency signal in a predetermined frequency band to pass therethrough depending on the turning-on and the turning-off of the switch SW (third switch) of the frequency varying circuit 11 in the filter 20.

Although, for the sake of simplicity, this embodiment is described on an assumption that the number of filters is two, the number of filters is just required to be two or more and is not limited to a particular value. Thus, the number of individual terminals in the radio frequency front-end circuit 1 and the number of select terminals in the switching circuit 10 are also just required to be two or more and are not limited to particular values. In other words, the switching circuit 10 may include a number n (n is an integer of three or more) of SPST selector switches.

1-2. Switch Configuration

The switching circuit 10 (switch circuit) and the switch SW (third switch element) are each constituted by a switch IC (Integrated Circuit), for example. The switch 12a (first switch element) and the switch 13a of the switching circuit 10 and the switch SW of the frequency varying circuit 11 are, for example, switches, such as FETs, formed on or in one same semiconductor substrate. Configurations of the switches 12a and 13a and the switch SW are described below, but the configuration of each of the switches 12a and 13a and the configuration of the switch SW are similar except for the difference in design parameters. Taking into account the above point, the following description is made mainly about the matters regarding the switches 12a and 13a, and the matters regarding the switch SW are described in a simplified way.

FIG. 2A is a circuit diagram of the switching circuit 10. FIG. 2B is a plan view schematically illustrating a semiconductor substrate 201 (die) of a switch IC that constitutes the switching circuit 10 illustrated in FIG. 2A.

In more detail, as illustrated in FIG. 2A, the switching circuit 10 includes, in addition to the above-described switches 12a and 13a, switches 12b and 13b to ensure isolation between the common terminal 111 and the select terminal 112 and to suppress degradation of attenuation characteristics when the switch 12a is turned off, and further to ensure isolation between the common terminal 111 and the select terminal 113 and to suppress degradation of attenuation characteristics when the switch 13a is turned off. The switches 12b and 13b are not always required to be disposed.

The switch 12b switches over conduction and non-conduction between the select terminal 112 and the ground, and it is turned on and off in an exclusive relation to the switch 12a. In other words, the switch 12b is turned off when the switch 12a is turned on, and is turned on when the switch 12a is turned off.

The switch 13b switches over conduction and non-conduction between the select terminal 113 and the ground, and it is turned on and off in an exclusive relation to the switch 13a. In other words, the switch 13b is turned off when the switch 13a is turned on, and is turned on when the switch 13a is turned off.

In this embodiment, as illustrated in FIG. 2B, the switches 12a, 12b, 13a and 13b are formed on or in the semiconductor substrate 201. An input electrode Input constituting the common terminal 111, an output electrode Output1 constituting the select terminal 112, an output electrode Output2 constituting the select terminal 113, and a ground electrode GND constituting a ground terminal are disposed as surface electrodes on or in the semiconductor substrate 201.

A control circuit 210 is further disposed on or in the semiconductor substrate 201. The control circuit 210 is operated in accordance with a power supply voltage VDD supplied from a power supply circuit such as a power management IC, and generates a plurality of switch drive voltages for individually turning on and off the switches 12a, 12b, 13a and 13b in accordance with a control signal VC1 inputted from the RFIC, for example.

The configuration of the semiconductor substrate 201 is not limited to the above-described example. In another example, bumps for connection to an external substrate, such as a mother board, may be disposed on the surface electrodes. The surface electrodes may be connected to the external substrate by using bonding wires without being limited to the bumps.

In this embodiment, the switches 12a, 12b, 13a and 13b are each made up of a plurality of switch elements (hereinafter referred to as "split switch elements"), which are formed by splitting one switch element in series. In this embodiment, though not illustrated, the switch SW of the frequency varying circuit 11 is also made up of a plurality of split switch elements. In those split switch elements, a withstand voltage (breakdown voltage) per element in an off-state is specified (e.g., about 2.5 V) depending on a manufacturing process. In addition, the number of split switch elements constituting the switch SW (third switch element) is greater than the number of split switch elements constituting the switch 12a (first switch element).

More specifically, in this embodiment, the split switch elements are FETs. Thus, the switches 12a and SW are each constituted by a plurality of FETs connected in series. For example, the switch 12a is constituted by ten FETs connected in series.

In the following, regarding each of the switches 12a, 12b, 13a and 13b of the switching circuit 10 and the switch SW of the frequency varying circuit 11, a region in the semiconductor substrate where the FETs are formed is called an "FET section", and an area of the FET section in a plan view of the semiconductor substrate is simply called an "area of the FET section". Thus, in this embodiment, the area of the FET section in one switch implies a total area of the plurality of FETs formed by splitting the one switch in series. In other words, the area of the FET section in the switch implies a total area of the plurality of FETs connected in series.

An on-resistance of each of the above-mentioned switches (i.e., the switches 12a, 12b, 13a, 13b and SW) is described here as a resistance of only the FET section in each switch. Thus, in this embodiment, the on-resistance of one switch implies a total on-resistance of the plurality of FETs formed by splitting the one switch in series. In other words, the on-resistance of the switch implies a total on-resistance of the plurality of FETs connected in series.

In the switch having the above-described configuration, the on-resistance, the area of the FET section, the withstand voltage, etc. are specified by design parameters for the switch, etc. Taking into account the above point, the design parameters for the switch will be described below. The following FET structure is intended to explain a typical structure of each of the switches 12a, 12b, 13a, 13b and SW. This implies that polarities, electrode structures, materials, etc. of the FET are not limited to the matters described below.

In this embodiment, each FET (split switch element) is formed by connecting a plurality of unit elements constituting the FET in parallel.

Each of FIGS. 3A and 3B schematically illustrates a structure of a unit element 11e constituting the FET; specifically, FIG. 3A is a sectional perspective view, and FIG. 3B is a plan view.

As illustrated in FIGS. 3A and 3B, the unit element 11e constituting the FET is an n-MOS (Metal Oxide Semiconductor) FET, for example, and it includes a p-type semiconductor substrate 201, n-type diffusion layers 211 and 212 formed in the semiconductor substrate 201, a source electrode 221S and a drain electrode 221D formed respectively on the diffusion layers 211 and 212, an insulating film 222 formed between the source electrode 221S and the drain electrode 221D, and a gate electrode 221G formed on the insulating film 222. In the unit element 11e constituting the FET, when a positive potential relative to a reference potential (e.g., 0 V) is applied to the gate electrode 221G, a channel layer 213 is formed in a surface layer of the semiconductor substrate 201 under the gate electrode 221G. Accordingly, the unit element 11e constituting the FET is turned on at that time.

The materials of the unit element 11e constituting the FET are not limited to particular ones. For example, a GaAs substrate or a silicon substrate may be used as the semiconductor substrate 201, and a metal wiring made of Al, for example, may be used as each of the source electrode 221S and the drain electrode 221D. A conductor wiring made of polysilicon, for example, may be used as the gate electrode 221G, and an oxide film made of $SiO_2$, for example, may be used as the insulating film 222.

Here, the size of the gate electrode 221G in a direction in which the source electrode 221S and the drain electrode 221D are arrayed is called a "gate length", and the size of the gate electrode 221G in a direction perpendicular to the above array direction is called a "gate width".

The on-resistance of the FET (split switch element) constituted by the plurality of unit element 11e connected in parallel is specified depending on the thickness of the insulating film 222, the gate length, the gate width, etc. The thickness of the insulating film 222 and the gate length are determined depending on the manufacturing process. Therefore, the gate width needs to be increased in order to reduce the on-resistance of the FET that includes the unit elements 11e constituting the FET.

A method of forming the FET having a large gate width may be provided, for example, as a method of increasing the size of the FET constituted by one set of S (source)-G (gate)-D (drain), or a method of connecting the plurality of unit elements 11e constituting the FET and made up of S-G-D in parallel, as illustrated in FIG. 3C. FIG. 3C is a plan view schematically illustrating a configuration of an FET 11p that includes the plurality (here, four) of unit elements 11e constituting the FET and connected in parallel. In this case, the gate width of each unit element 11e constituting the FET is called a "finger length", and the number of unit elements 11e constituting the FET and connected in parallel is called the "number of fingers". Among the finger length, the number of fingers, and the gate width of the FET 11p, a relation of "gate width"="finger length"×"number of fingers" is held.

Thus, the on-resistance and the area of the FET section among the design parameters for the switch are in a trade-off relation.

In general, a comparatively high RF voltage is applied to the switch in an off-state. When the switch is formed on or in the semiconductor substrate, the withstand voltage of the switch is determined depending on the manufacturing process. To ensure the demanded withstand voltage, therefore, a plurality of FETs needs to be connected in series (i.e., stacked). The number of FETs connected in series is called the "number of stacks". The overall withstand voltage of the switch can be raised by increasing the number of stacks.

However, as the on-resistance of the entire switch increases, the area of the FET section in the switch also increases. In other words, among the design parameters for the switch, the withstand voltage and each of the on-resistance and the area of the FET section are in a trade-off relation.

FIG. 3D is a plan view schematically illustrating, in an enlarged scale, the configuration of the switch 12a in the semiconductor substrate 201 illustrated in FIG. 2B.

As illustrated in FIGS. 3B and 3C, the switch 12a includes the plurality (here, ten) of FETs 11p connected in series, and each FET 11p includes the plurality (here, four) of unit elements 11e constituting the FET and connected in parallel. More specifically, in FIG. 2B, the switches 12a, 12b, 13a and 13b are schematically illustrated in the form of a plurality of arrayed rectangles. Those rectangles schematically represent that the FETs 11p are connected in series, and each rectangle schematically represents that the unit elements 11e constituting each FET are connected in parallel. The above point is similarly applied to other plan views referenced to in the following description.

The number of stacks in each of the switches 12a, 12b, 13a and 13b, etc. is not limited to the number of rectangles illustrated in the plan view.

As described above, among the design parameters for the switch, the on-resistance and the area of the FET section are in a trade-off relation, and the withstand voltage and each of the on-resistance and the area of the FET section are in a trade-off relation. Accordingly, the design parameters for the switch need to be determined as appropriate depending on the demanded characteristics.

In the radio frequency front-end circuit 1 in which size reduction and loss reduction in the pass band are both demanded, it is not easy to determine the design parameters to meet the demand. Stated in another way, in trying to reduce the loss in the pass band by reducing the on-resistance, the area of the FET section is increased, and hence the overall size of the radio frequency front-end circuit 1 is increased. On the other hand, in trying to reduce the area of the FET section, the on-resistance is increased, and hence a difficulty arises in reducing the loss.

In this regard, the inventors of this application has accomplished the present invention with attention focused on the fact that degrees of influence upon the loss in the pass band caused by the on-resistance are different between the switch 12a of the switching circuit 10 and the switch SW of the frequency varying circuit 11 in the filter 20 because paths in which those switches are disposed are different from each other. More specifically, in the radio frequency front-end circuit 1 according to this embodiment, the on-resistance of the switch 12a (first switch element) of the switching circuit 10 is smaller than that of the switch SW (third switch element) of the frequency varying circuit 11 in the filter 20. For instance, the on-resistance of the switch 12a of the switching circuit 10 is not greater than 2Ω, and the on-resistance of the switch SW of the frequency varying circuit 11 is 3Ω. Based on the above point, the size reduction and the loss reduction in the pass band can be both achieved in the radio frequency front-end circuit 1. The reason why such an advantageous effect can be obtained is as follows.

2. Mechanism of Reduction in Size and Loss 2-1. Relation Between On-Resistance and Change Amount of Insertion Loss in Pass Band FIG. 4 is a graph depicting a change amount of insertion loss (I.L.) in the pass band between the antenna terminal 101 and the individual terminal 102 of the radio frequency front-end circuit 1 relative to the on-resistance of the switch 12a of the switching circuit 10 and the on-resistance of the switch SW of the frequency varying circuit 11. In the following, the above-mentioned insertion loss is simply called the "insertion loss in the pass band" in some cases.

More specifically, points plotted as "SELECTOR SWITCH" in FIG. 4 are points representing increments of the insertion loss in the pass band when the on-resistance is gradually increased, while a reference is set to the insertion loss in the pass band between the antenna terminal 101 and the individual terminal 102, the insertion loss being obtained on an assumption that the switch 12a of the switching circuit 10 is turned on with the on-resistance of 0Ω. In this connection, although there is no limitation on whether the switch SW of the frequency varying circuit 11 is turned on or off, the following description is made, by way of example, about the case that the switch SW is turned on.

On the other hand, points plotted as "TUNING SWITCH" in FIG. 4 are points representing increments of the insertion loss in the pass band when the on-resistance is gradually increased, while a reference is set to the insertion loss in the pass band between the antenna terminal 101 and the individual terminal 102, the insertion loss being obtained on an assumption that the switch SW of the frequency varying circuit 11 is turned on with the on-resistance of 0Ω. In this case, the switch 12a of the switching circuit 10 is turned on.

The "pass band" herein implies the pass band of the filter 20 (first filter) when the switch SW is turned on.

As seen from FIG. 4, in both of the switch 12a of the switching circuit 10 and the switch SW of the frequency varying circuit 11, the change amount of the insertion loss in the pass band increases as the on-resistance increases. However, it is also understood that the increase of the on-resistance of the switch 12a of the switching circuit 10 increases the insertion loss in the pass band at a greater rate than the increase of the on-resistance of the switch SW of the frequency varying circuit 11.

The reason of the above result is as follows.

In the frequency varying circuit 11 illustrated in FIG. 1, when the switch SW is turned on, the switch SW is connected between the parallel arm resonator p1 and the ground. In this case, the impedance at the anti-resonant frequency of the parallel arm resonator p1, which forms the pass band of the filter 20, becomes ideally infinite. Thus, even when the on-resistance of the switch SW is added to the impedance at the anti-resonant frequency of the parallel arm resonator p1 with the turning-on of the switch SW, there is substantially no loss increase in the filter 20 (i.e., increase of the insertion loss in the pass band) due to the added on-resistance of the switch SW).

Furthermore, the impedance at the resonant frequency of the parallel arm resonator p1, which forms the attenuation pole on the lower frequency side of the pass band, becomes ideally 0. Accordingly, when the on-resistance of the switch SW is added to the impedance at the resonant frequency of the parallel arm resonator p1 with the turning-on of the switch SW, the attenuation is decreased due to the added on-resistance of the switch SW. However, an influence of the decrease of the attenuation is small and negligible.

Thus, even with the on-resistance of the switch SW of the frequency varying circuit 11 being large, the influence upon the characteristics of the filter 20 is small, and hence the increase of the insertion loss in the pass band of the radio frequency front-end circuit 1 is less apt to occur.

In contrast, the switch 12a of the switching circuit 10 gives a resistance connected in series to a path that is constituted by a 50Ω line, for example, and that connects the antenna terminal 101 and the individual terminal 102. Accordingly, when the on-resistance of the switch 12a increases, the insertion loss in the radio frequency front-end circuit 1 also increases in proportion to the increase of the relevant on-resistance.

2-2. Relation Between Area of FET Section and Change Amount of Insertion Loss in Pass Band FIG. 5 is a graph depicting a change amount of the insertion loss in the pass band relative to the area of the FET section in the switch 12a of the switching circuit 10 and the area of the FET section in the switch SW of the frequency varying circuit 11. FIG. 5 represents data in the case of setting the number of stacks to 10 in each of the switch 12a and the switch SW.

More specifically, points plotted as "SELECTOR SWITCH" or "TUNING SWITCH" in FIG. 5 are points representing increments of the insertion loss in the pass band when the area of the FET section in the switch 12a of the switching circuit 10 and the area of the FET section in the switch SW of the frequency varying circuit 11 are gradually decreased, while a reference is set to the insertion loss in the pass band that is obtained on an assumption of similar conditions (i.e., the on-resistance is 0Ω, namely the area of the FET section is infinite) to those assumed in the case of FIG. 4.

As seen from FIG. 5, as the area of the FET section decreases, the insertion loss in the pass band increases exponentially. However, it is also understood that the decrease of the area of the FET section in the switch 12a of the switching circuit 10 increases the insertion loss in the pass band at a greater rate than the decrease of the area of the FET section in the switch SW of the frequency varying circuit 11.

Because the on-resistance and the area of the FET section are in a trade-off relation, the above result is deduced from the same reason as that causing the above-described relation between the on-resistance and the change amount of the insertion loss in the pass band.

2-3. Correlation Between On-Resistance and Total Area of FET Sections

From the above-described relations plotted in FIGS. 4 and 5, the inventors of this application have found the following correlation. Assuming that the on-resistance of the switch 12a (first switch element) is denoted by Ron1 and the on-resistance of the switch SW (third switch element) is denoted by Ron2, an on-resistance ratio Ron1/Ron2 between those two switches 12a and SW and a total area of the FET sections (FET section total area) exhibit the correlation plotted in FIG. 6A on condition that the insertion loss in the pass band is constant.

FIG. 6A is a graph depicting a relation of the total area of the FET sections with respect to the on-resistance ratio Ron1/Ron2 on condition that the number of stacks of the switch 12a is set to 6 and the number of stacks of the switch SW is set to 10, and that the insertion loss in the pass band is held constant. The graph further plots the on-resistance ratio Ron1/Ron2 and the total area of the FET sections (FET section total area) when a reference resistance is changed to be set to 1, 2 and 3Ω. Here, the term "reference resistance" stands for the on-resistance of each of the switches 12a and SW when the on-resistance ratio Ron1/Ron2 is 1.0.

FIG. 6B is a graph depicting a relation of the insertion loss in the pass band with respect to the on-resistance ratio Ron1/Ron2 on condition that the number of stacks of the switch 12a is set to 6 and the number of stacks of the switch SW is set to 10, and that the total area of the FET sections is held constant.

As seen from those graphs, regardless of which value the reference resistance takes, when Ron1/Ron2 is changed while the insertion loss in the pass band is held constant, the total area of the FET sections is also changed. More specifically, the total area of the FET sections is changed with respect to Ron1/Ron2 such that it is minimized at Ron1/Ron2 of less than 1. Thus, when the on-resistance Ron1/Ron2 is less than 1, the total area of the FET sections is smaller than that in the case of Ron1/Ron2=1, i.e., Ron1=Ron2.

In the example plotted in FIG. 6A, however, when Ron1/Ron2 is much smaller than 1, the total area of the FET sections becomes larger than that in the case of Ron1/Ron2=1. Thus, assuming the total area of the FET sections in the case of Ron1/Ron2=1 to be a reference area, the total area of the FET sections can be reduced in a range of Ron1/Ron2 where the total area of the FET sections is smaller than the reference area. In FIG. 6A, for example, the total area of the FET sections can be reduced in the range of about 0.34<Ron1/Ron2<1, and such a range is not changed even when the reference resistance value is changed.

Assuming that a lower limit value of the range of Ron1/Ron2 where the total area of the FET sections is smaller than the above-mentioned reference area is denoted by α, α is changed depending on a stack number ratio N1/N2, i.e., a ratio of the number N1 of stacks in the switch 12a to the number N2 of stacks in the switch SW. The above point is illustrated in FIG. 7A.

FIG. 7A is a graph depicting a relation between the on-resistance ratio (Ron1/Ron2) and the total area of the FET sections when the number of stacks is changed. More specifically, FIG. 7A plots the above-mentioned relation when the number N1 of stacks in the switch 12a is set to 6, 8 and 10 and the number N2 of stacks in the switch SW is fixed to 10.

As seen from FIG. 7A, when the number N2 of stacks in the switch SW is fixed, α is smaller at the smaller number N1 of stacks in the switch 12a, and is greater at the greater number N1 of stacks in the switch 12a. In other words, it is understood that α is smaller at the smaller stack number ratio N1/N2, i.e., at the smaller ratio of the number N1 of stacks in the switch 12a to the number N2 of stacks in the switch SW, and is greater at the greater stack number ratio.

Thus, when the on-resistance ratio (Ron1/Ron2) is changed with the insertion loss set to an arbitrary fixed value, the total area of the FET sections is expressed by a function having a downward convex shape. Here, assuming that the total area of the FET sections in the case of the on-resistance ratio Ron1/Ron2=1 is the reference area, α is given by the on-resistance ratio at which the total area of the FET sections is equal to the reference area in a monotonously decreasing region of the above-described function having a downward convex shape.

FIG. 7B is a graph depicting a relation between the ratio of the number N1 of stacks in the switch 12a to the number N2 of stacks in the switch SW and α.

As seen from FIG. 7B, α decreases as the stack number ratio N1/N2 decreases.

As described above, the switch 12a and the switch SW are each constituted by the plurality of FETs (split switch elements) connected in series, each FET having the specified withstand voltage. Thus, in the switch 12a and the switch SW, because the RF voltage applied to each switch can be divided to be separately applied to the FETs connected in series, the withstand voltage can be raised by increasing the number of FETs connected in series (i.e., the number of stacks). Accordingly, the number N1 of stacks in the switch 12a and the number N2 of stacks in the switch SW need to be determined depending on the voltages applied to those switches.

The case that a high voltage is applied to the switch SW of the frequency varying circuit 11 will be described below, by way of example, in connection with a filter according to Examples.

FIG. 8A is a circuit diagram of the filter according to Examples.

As illustrated in FIG. 8A, the filter according to Examples includes serial arm resonators s31 to s35, and parallel arm resonators p31, p32a, p32b, p33a, p33b, p34a, p34b, p35 and p36. Here, resonant frequencies of the parallel arm resonators p32a, p33a, and p34a are lower than those of the parallel arm resonators p32b, p33b, and p34b and the serial arm resonators s31 to s35. Anti-resonant frequencies of the parallel arm resonators p32a, p33a, and p34a are lower than those of the parallel arm resonators p32b, p33b, and p34b and the serial arm resonators s31 to s35.

The filter further includes capacitors C32 to C34 (first impedance elements) to vary a frequency of the filter (here, a frequency of its pass band), and switches SW32 to SW34 (third switch elements). The capacitor C32 and the switch SW32 are connected in parallel to constitute one frequency varying circuit, and they are connected in series to the parallel arm resonator p32b. The capacitor C33 and the switch SW33 are connected in parallel to constitute one frequency varying circuit, and they are connected in series to the parallel arm resonator p33b. The capacitor C34 and the switch SW34 are connected in parallel to constitute one frequency varying circuit, and they are connected in series to the parallel arm resonator p34b.

The above-described filter according to Examples is a tunable filter in three stages each having a configuration of a later-described filter 20D according to Configuration Example 4 of Embodiment 1.

FIG. 8B is a graph depicting filter characteristics (band-pass characteristics) of the above-described filter according to Examples. As seen from FIG. 8B, in the filter according to Examples, the frequencies of the pass band and an attenuation band can be shifted (varied) by selectively turning on and off the switches SW32 to SW34 (tuning switches) of the frequency varying circuits.

FIG. 8C is a graph comparatively depicting an RF voltage (denoted by a solid line in the graph) applied to the switch SW34 of the frequency varying circuit, which is subjected to a maximum voltage in an off-state, and an RF voltage (denoted by a dotted line in the graph) applied to the switch 12a of the switching circuit 10 in an off-state, when electric power of 36 dBm is applied to an input/output terminal 122.

As seen from FIG. 8C, a voltage of 17.9 V is applied to the switch 12a of the switching circuit 10 in the pass band, and a voltage of 42.4 V is applied to the switch SW34 in the pass band. Accordingly, assuming that the withstand voltage for each of the plurality of FETs constituting the switch is 2.5 V, the ratio of the number N1 of stacks in the switch 12a to the number N2 of stacks in the switch SW34 needs to be 0.42 or more.

As understood from the above-described Example, the stack number ratio N1/N2, i.e., the ratio of the number N1 of stacks in the switch 12a to the number N2 of stacks in the switch SW, needs to be 0.42 or more, and α in the case of 0.42 is 0.24. Here, the switch 12a and the switch SW are constituted such that the on-resistance ratio Ron1/Ron2 falls within the range of greater than α and smaller than 1.

The reason why the total area of the FET sections is reduced when the on-resistance ratio Ron1/Ron2 is in the range of α<Ron1/Ron2<1 will be described below, taking as an example the case that the insertion loss in the pass band is constant.

Assuming that the respective areas of the FET sections in the switch 12a of the switching circuit 10 and the switch SW of the frequency varying circuit 11 are denoted by $S_1$ and $S_2$ in the mentioned order, and that the respective on-resistances of the switch 12a of the switching circuit 10 and the switch SW of the frequency varying circuit 11 are denoted by Ron1 and Ron2 in the mentioned order, a relation between a total area S of the FET sections and a change amount ΔIL of the insertion loss is deduced as expressed by the following formulae using coefficients $S_1$, $S_2$, $A_1$ and $A_2$. In the following formulae, Ron1 and Ron2 are expressed by $R_{on1}$ and $R_{on2}$, respectively.

$$S = \frac{S_1}{R_{on1}} + \frac{S_2}{R_{on2}}$$ [Math. 1]

$$\Delta IL = A_1 R_{on1} + A_2 R_{on2}$$ [Math. 2]

From the above formulae, the following second-order polynomial is obtained as a result of eliminating $R_{on2}$ and rearranging the expression for $R_{on1}$.

$$SA_1 R_{on1}^2 - (S\Delta IL + S_1 A_1 - S_2 A_2) R_{on1} + S_1 \Delta IL = 0$$ [Math. 3]

In this case, assuming ΔIL to be constant, there are two values of Ron1 at which the total area of the FET sections becomes S. One value of Ron1 satisfies Ron1/Ron2=1, and the other value satisfies Ron1/Ron2=α.

Here, $S_1$ denotes a coefficient in a relational expression when the number of FET elements is assumed to be constant. FIG. 9 is a graph depicting a relation of the area of the FET section with respect to the on-resistance ratio. More specifically, FIG. 9 plots the result when the number of FET elements is 10. In the case of fitting a power math function to the plotted curve, its coefficient is 41600 and this value represents $S_1$. Thus, assuming that the on-resistance is denoted by x, the area of the FET section is denoted by y, and a determination coefficient is given by $R^2=1$, the on-resistance and the area of the FET section fit to a regression formula $y=41600x^{-1}$.

Furthermore, $A_1$ and $A_2$ denote gradients when linear functions are fit to the relations between the on-resistance and the change amount of the insertion loss in the pass band illustrated in FIG. 4, and they satisfy $A_1 > A_2$.

3. Advantageous Effects

With the radio frequency front-end circuit 1 according to this embodiment, as described above, the on-resistance Ron1 of the switch 12a (first switch element) of the switching circuit 10 (switch circuit) is smaller than the on-resistance Ron2 of the switch SW (third switch element) of the frequency varying circuit 11 in the filter 20 (first filter).

As discussed above, even with the on-resistance of the switch SW of the frequency varying circuit 11 being large, the influence upon the characteristics of the filter 20 is small, and hence the increase of the insertion loss in the pass band of the radio frequency front-end circuit 1 is less apt to occur. In contrast, when the on-resistance of the switch 12a of the switching circuit 10 is increased, the insertion loss in the radio frequency front-end circuit 1 is also increased in proportion to the increase of such an on-resistance. Moreover, in each of the switch 12a and the switch SW, the size (area of the FET section in this embodiment) and the on-resistance are in a trade-off relation. By setting the on-resistance Ron1 of the switch 12a (first switch element) to be smaller than the on-resistance Ron2 of the switch SW (third switch element) of the frequency varying circuit 11 in the filter 20 (first filter), therefore, the size of the switch SW can be reduced while the increase of the insertion loss in the pass band can be suppressed. Thus, with the radio frequency front-end circuit 1 according to this embodiment, the loss in the pass band can be reduced and the size reduction can be realized concurrently.

Furthermore, with the radio frequency front-end circuit 1 according to this embodiment, the switch 12a (first switch element) and the switch SW (third switch element) are constituted such that the on-resistance ratio Ron1/Ron2 falls within the range of greater than α and smaller than 1.

As discussed above, if the on-resistance ratio is too large or too small, a total size resulting from adding the size of the switch 12a and the size of the switch SW (i.e., the total area of the FET sections in this embodiment) and the insertion loss in the pass band increase. In other words, the loss reduction in the pass band and the size reduction can be both realized by setting the on-resistance ratio Ron1/Ron2 so as to fall within the appropriate range.

Here, α depends on a maximum voltage ratio, i.e., a ratio of a maximum voltage applied to the switch SW to a maximum voltage applied to the switch 12a, and α increases as the maximum voltage ratio increases. In addition, the maximum voltage ratio is specified by the circuit configuration, etc. Therefore, if α is too small, the total size resulting from adding the size of the switch 12a and the size of the switch SW and the insertion loss in the pass band increase. In other words, since the switch 12a and the switch SW are constituted such that α falls within the appropriate range, the loss reduction in the pass band and the size reduction can be both realized.

With the radio frequency front-end circuit 1 according to this embodiment, the number of FETs (i.e., the stack number N2) connected in series and constituting the switch SW (third switch element) is greater than the number of FETs (i.e., the stack number N1) connected in series and constituting the switch 12a (first switch element).

In each of the switch 12a and the switch SW, when the switch is constituted by a plurality of switch elements such as FETs, an RF voltage applied to the switch can be divided to be applied to the plurality of switch elements connected in series. Therefore, the withstand voltage can be raised by increasing the number of switch elements connected in series.

Here, a higher RF voltage is applied to the switch SW than to the switch 12a in the off-state. Thus, by setting the number of switch elements constituting the switch SW to be greater than the number of switch elements constituting the switch 12a, it is possible to improve the withstand voltage characteristics of the switch SW, and to improve the electric power handling characteristics in the filter 20.

In this connection, the on-resistance Ron1 of the switch 12a is smaller than the on-resistance Ron2 of the switch SW; namely the on-resistance Ron2 of the switch SW is greater than the on-resistance Ron1 of the switch 12a. Therefore, an increase of the size of the switch SW can be suppressed even with the number of switch elements constituting the switch SW (i.e., the stack number N2) being greater than the number of switch elements constituting the switch 12a (i.e., the stack number N1). As a result, an increase of the overall size of the radio frequency front-end circuit 1 having the above-described configuration can be suppressed.

With the radio frequency front-end circuit 1 according to this embodiment, since the switch elements (split switch elements in this embodiment) constituting the switch 12a and the switch elements constituting the switch SW are FETs, the on-resistance can be easily adjusted by adjusting the gate width.

In general, a switch formed on or in a semiconductor substrate (i.e., the so-called semiconductor switch) can be formed in a smaller size than another type of switch such as a mechanical switch. With the radio frequency front-end circuit 1 according to this embodiment, since the switch 12a and the switch SW are each formed on or in the semiconductor substrate, further size reduction can be realized in the entirety of the radio frequency front-end circuit 1.

Furthermore, in general, a switch element is constituted in the form of a package separate from that of a resonator and an impedance element. Thus, by forming both the switch 12a and the switch SW on one same semiconductor substrate, still further size reduction can be realized in the entirety of the radio frequency front-end circuit 1.

4. Configuration Examples of Tunable Filter

The configuration of the filter 20 (tunable filter) in the above-described radio frequency front-end circuit 1 is just required to include the parallel arm resonator p1 and the frequency varying circuit 11, and it is not limited to a particular one. From that point of view, the configuration examples of the filter 20 will be described in detail below.

4-1. Configuration Example 1

FIG. 10A is a circuit diagram of a filter 20A according to Configuration Example 1.

As illustrated in FIG. 10A, the filter 20A includes a serial arm resonator s1 corresponding to the serial arm resonance circuit in FIG. 1, a parallel arm resonator p1, a capacitor C1 (first impedance element), and a switch SW (third switch element).

The serial arm resonator s1 is connected between the input/output terminal 121 (first input/output terminal) and the input/output terminal 122 (second input/output terminal), and it has a resonant frequency within a pass band of the filter 20A and an anti-resonant frequency on the higher frequency side of the pass band.

The parallel arm resonator p1 is a first parallel arm resonator p1 connected between a node (node x1 in FIG. 10A) on a path connecting the input/output terminal 121 to the input/output terminal 122 and a ground (reference terminal). In other words, the parallel arm resonator p1 is a resonator disposed in a path connecting the node x1 on the above-mentioned path to the ground.

The parallel arm resonator p1 has a resonant frequency on the lower frequency side of the pass band of the filter 20A and an anti-resonant frequency within the pass band. In this embodiment, the resonant frequency of the parallel arm resonator p1 is lower than that of the serial arm resonator s1, and the anti-resonant frequency of the parallel arm resonator p1 is lower than that of the serial arm resonator s1.

The capacitor C1 is connected between the node (node x1 in FIG. 10A) on the path connecting the input/output terminal 121 to the input/output terminal 122 and the ground (reference terminal).

The capacitor C1 is formed, for example, as the so-called MIM (Metal-Insulator-Metal) capacitor, on or in one same semiconductor substrate as for the switch SW by a semiconductor process.

Table 1 indicates capacitance values per unit area when the capacitor C1 is formed on or in a semiconductor substrate and a dielectric substrate (relative permeability=6, sheet thickness=12.5 μm). Table 2 indicates values of area needed to realize the capacitor C1 having the capacitance value of 2 pF.

TABLE 1

| Formation Method | Capacitance per Unit Area (pF/mm$^2$) |
| --- | --- |
| Semiconductor Substrate | 170 |
| Dielectric Substrate | 4 |

TABLE 2

| Formation Method | Area Needed to Obtain 2 pF (mm$^2$) |
| --- | --- |
| Semiconductor Substrate | 0.012 |
| Dielectric Substrate | 0.5 |
| Chip Multilayer Capacitor | 0.08 |

Here, the area of a capacitance portion of the chip multiplayer capacitor denotes the value resulted, by way of example, in the case of using, as the chip multiplayer capacitor, a chip having a 0402 (0.4 mm×0.2 mm) size. In addition, a space margin needed for mounting is not taken into account.

As seen from Table 2, the area of the capacitor C1 can be reduced by forming the capacitor C1 on the semiconductor substrate. The formation method for the capacitor C1 is not limited to the above-described examples, and the capacitor C1 may be constituted by forming a comb-shaped electrode or a multilayer structure on a piezoelectric substrate, for example, in consideration of the filter characteristics, the size, etc. demanded for the filter 20A. Alternatively, the capacitor C1 may be constituted as a variable capacitor such as a varicap or a DTC (Digital Tunable Capacitor).

In this configuration example, the parallel arm resonator p1 and the capacitor C1 are connected in series to each other, and are connected between the node x1 and the ground. In this configuration example, one terminal of the parallel arm resonator p1 is connected to the node x1, and the other end thereof is connected to one terminal of the capacitor C1. One terminal of the capacitor C1 is connected to the other end of the parallel arm resonator p1, and the other terminal thereof is connected to the ground. The order in which the parallel arm resonator p1 and the capacitor C1 are connected is not limited to the above-mentioned connection order, and it may be reversed to the above-mentioned connection order. However, if the connection order is reversed, a loss in the pass band of the filter 20A is worsened. Moreover, in the case that the parallel arm resonator p1 is formed into a resonator chip (package) together with other acoustic wave resonators, the number of the terminals of the chip is increased, and hence the chip size is increased. From the viewpoint of filter characteristics and size reduction, therefore, the parallel arm resonator p1 and the capacitor C1 are preferably connected in the order described in this embodiment.

In this configuration example, the switch SW is a switch element that is connected in parallel to the capacitor C1, and that constitutes the frequency varying circuit 11 in cooperation with the capacitor C1. The switch SW is selectively turned on (conducted) or turned off (non-conducted) in accordance with a control signal from a control unit such as an RFIC (Radio Frequency Integrated Circuit). The frequency varying circuit 11 varies the frequency of the first parallel arm resonator (resonant frequency of the parallel arm resonator p1 in this configuration example) to which the frequency varying circuit 11 is connected.

The parallel arm resonator p1 and the frequency varying circuit 11 constitute a parallel arm resonance circuit 21 disposed in a path that connects the node x1 on the path connecting the input/output terminal 121 to the input/output terminal 122 and the ground. In other words, the parallel arm resonance circuit 21 is disposed in one parallel arm connecting a serial arm and the ground. Thus, the filter 20A has a ladder filter structure of one stage that is constituted by the serial arm resonator s1 (serial arm resonance circuit) and the parallel arm resonance circuit.

FIG. 10B is a graph depicting filter characteristics (bandpass characteristics) of the filter 20A according to Configuration Example 1 of Embodiment 1. More specifically, FIG. 10B is a graph comparatively depicting the filter characteristics when the switch SW is turned on and off.

In the filter 20A, the pass band is formed by setting the anti-resonant frequency of the parallel arm resonance circuit 21 and the resonant frequency of the serial arm resonance circuit (serial arm resonator s1 in this configuration example) close to each other.

In this configuration example, only when the switch SW is turned off, the capacitor C1 is additionally connected to the parallel arm resonator p1. Accordingly, the resonant frequency of the parallel arm resonance circuit 21 in the off-state of the switch SW is shifted to the higher frequency side than the resonant frequency of the parallel arm resonator p1 alone. Here, an attenuation pole on the lower frequency side of the pass band of the filter 20A is specified by the resonant frequency of the parallel arm resonance circuit 21. In the filter 20A, therefore, a frequency of the attenuation pole on the lower frequency side of the pass band can be shifted to the higher frequency side with the switch SW being turned off from on. In other words, the filter 20A can shift the pass band depending on the selective turning-on and -off of the switch SW.

In this respect, a frequency variable width of the pass band of the filter 20A depends on the constant of the capacitor C1 (first impedance element). For instance, the frequency variable width widens as the constant of the capacitor C1 reduces. Thus, the constant (capacitance value) of the capacitor C1 is determined as appropriate depending on frequency specifications demanded for the filter 20A.

The first impedance element is not limited to a capacitor, and it may be an inductor, for example. In the case of using an inductor as the first impedance element, the inductor is additionally connected to the parallel arm resonator p1 only when the switch SW is turned off. Accordingly, the resonant frequency of the parallel arm resonance circuit 21 in the off-state of the switch SW is shifted to the lower frequency side than the resonant frequency of the parallel arm resonator p1 alone. In the filter 20A, therefore, the frequency of the attenuation pole on the lower frequency side of the pass band can be shifted to the lower frequency side with the switch SW being turned off from on.

In this respect, a frequency variable width of the pass band of the filter 20A depends on the constant of the inductor. For instance, the frequency variable width widens as the constant of the inductor increases. Thus, the constant of the inductor is determined as appropriate depending on the frequency specifications demanded for the filter 20A. Furthermore, the inductor may be a variable inductor using MEMS (Micro Electro Mechanical Systems). In such a case, the frequency variable width can be finely adjusted.

4-2. Configuration Example 2

In the above Configuration Example 1, the circuit including the switch SW and the capacitor C1 connected in parallel to each other has been described, by way of example, as the frequency varying circuit 11. However, the frequency varying circuit is not limited to the above-described configuration.

FIG. 11A is a circuit diagram of a filter 20B according to Configuration Example 2.

Comparing with the filter 20A illustrated in FIG. 10A, the filter 20B illustrated in FIG. 11A further includes an inductor L (second impedance element) that is connected in series to the switch SW. Thus, in this configuration example, a circuit including the switch SW and the inductor L connected in series to each other is connected in parallel to the capacitor C1, thereby constituting a frequency varying circuit 11B. Furthermore, the frequency varying circuit 11B is connected to the parallel arm resonator p1 (first parallel arm resonator), thereby constituting a parallel arm resonance circuit 21B. In other words, the switch SW is connected in parallel to the capacitor C1 via the inductor L.

The order in which the switch SW and the inductor L are connected is not limited to a particular one, and it may be reversed to the connection order illustrated in FIG. 11A.

FIG. 11B is a graph depicting filter characteristics (bandpass characteristics) of the filter 20B according to Configuration Example 2 of Embodiment 1. More specifically, FIG. 11B is a graph comparatively depicting the filter characteristics when the switch SW is turned on and off.

In the filter 20B, a pass band is formed by setting an anti-resonant frequency of the parallel arm resonance circuit 21B and a resonant frequency of a serial arm resonance circuit (serial arm resonator s1 in this configuration example) close to each other.

In this configuration example, when the switch SW is turned on, the inductor L is additionally connected to the parallel arm resonator p1, and when the switch SW is turned off, the capacitor C1 is additionally connected to the parallel arm resonator p1. Accordingly, the resonant frequency of the parallel arm resonance circuit 21B in the on-state of the switch SW is shifted to the lower frequency side than the resonant frequency of the parallel arm resonator p1 alone, and the resonant frequency of the parallel arm resonance circuit 21B in the off-state of the switch SW is shifted to the higher frequency side than the resonant frequency of the parallel arm resonator p1 alone. In the filter 20B according to this configuration example, therefore, the frequency variable width of the pass band can be made wider than that in the filter 20A according to Configuration Example 1. In other words, this configuration example can shift the frequency of the attenuation pole on the lower frequency side of the pass band over a wider range depending on the selective turning-on and -off of the switch SW.

The capacitor C1 and the inductor L may be connected in exchanged positions. Thus, a circuit including the switch SW and the capacitor C1 connected in series to each other may be connected in parallel to the inductor L. In such a configuration, a direction in which the frequency of the attenuation pole is shifted with the selective turning-on and -off of the switch SW is reversed to the direction in the filter 20B according to Configuration Example 2.

4-3. Configuration Example 3

In the above Configuration Examples 1 and 2, the one parallel arm resonator p1 (first parallel arm resonator) is disposed between the node x1 and the ground. However, another parallel arm resonator (second parallel arm resonator) different from the parallel arm resonator p1 may be disposed between the node x1 and the ground.

FIG. 12A is a circuit diagram of a filter 20C according to Configuration Example 3.

The filter 20C illustrated in FIG. 12A includes a parallel arm resonance circuit 21C instead of the parallel arm resonance circuit 21 included in the filter 20A illustrated in FIG. 10A. Comparing with the parallel arm resonance circuit 21, the parallel arm resonance circuit 21C further includes a parallel arm resonator p2 (second parallel arm resonator) that is connected between the node x1 and the ground. A resonant frequency of the parallel arm resonator p2 is different from the resonant frequency of the parallel arm resonator p1, and an anti-resonant frequency of the parallel arm resonator p2 is different from the anti-resonant frequency of the parallel arm resonator p1. In other words, the parallel arm resonator p1 and the parallel arm resonator p2 are connected to the one node x1 on the path connecting the input/output terminal 121 to the input/output terminal 122.

Thus, the filter 20C can shift a frequency of at least one of an attenuation pole on the lower frequency side of a pass band and an attenuation pole on the higher frequency side of the pass band. In other words, the frequency of at least one of the attenuation pole on the lower frequency side of the pass band and the attenuation pole on the higher frequency side of the pass band can be shifted depending on the selective turning-on and -off of the switch SW.

Here, the wording "one node" implies not only one point on a transfer line, but also two different points that are positioned on one transfer line without any resonator or impedance element interposed between the two points.

More specifically, the parallel arm resonator p2 has the resonant frequency higher than that of the parallel arm resonator p1, and the anti-resonant frequency higher than that of the parallel arm resonator p1. The frequency varying circuit 11 is connected in series to only the parallel arm resonator p1 out of the parallel arm resonator p1 and the parallel arm resonator p2. Thus, the parallel arm resonator p2 is connected in parallel to a circuit including the parallel arm resonator p1 and the frequency varying circuit 11 connected in series to each other.

FIG. 12B is a graph depicting filter characteristics (bandpass characteristics) of the filter 20C according to Configuration Example 3 of Embodiment 1. More specifically, FIG. 12B is a graph comparatively depicting the filter characteristics when the switch SW is turned on and off.

In the parallel arm resonance circuit 21C, impedance is locally minimized at the respective resonant frequencies of the parallel arm resonators p1 and p2. In other words, the parallel arm resonance circuit 21C has two resonant frequencies. Moreover, in the parallel arm resonance circuit 21C, impedance is locally maximized in a frequency band between the two resonant frequencies and in a frequency band on the higher frequency side than those two resonant frequencies. In other words, the parallel arm resonance circuit 21C has two anti-resonant frequencies.

Thus, in the filter 20C, the pass band is formed by setting one of the two anti-resonant frequencies of the parallel arm resonance circuit 21C on the lower frequency side and a resonant frequency of a serial arm resonance circuit (serial arm resonator s1 in this configuration example) close to each other.

In this configuration example, only when the switch SW is turned off, the capacitor C1 is additionally connected to the parallel arm resonator p1. Accordingly, one of the two resonant frequencies of the parallel arm resonance circuit 21C on the lower frequency side is shifted in the off-state of the switch SW to the higher frequency side than the resonant frequency of the parallel arm resonator p1 alone. Furthermore, the anti-resonant frequency of the parallel arm resonance circuit 21C on the lower frequency side is shifted in the off-state of the switch SW to the higher frequency side than the anti-resonant frequency in the on-state of the switch SW. Here, the attenuation pole on the lower frequency side of the pass band of the filter 20C is specified by the resonant frequency of the parallel arm resonance circuit 21C on the lower frequency side. Moreover, the sharpness of an attenuation slope on the lower frequency side of the pass band is specified by a differential frequency between the resonant frequency and the anti-resonant frequency of the parallel arm resonance circuit 21C on the lower frequency side. In the filter 20C, therefore, with the switch SW being turned off from on, the pass band can be shifted to the higher frequency side in such a manner that the frequency of the attenuation pole on the lower frequency side of the pass band is shifted to the higher frequency side while an increase of insertion loss on the lower frequency side of the pass band is suppressed. In other words, depending on the selective turning-on and -off of the switch SW, the frequency of the attenuation pole on the lower frequency side of the pass band can be shifted and the increase of the insertion loss on the lower frequency side of the pass band can be suppressed at the same time.

4-4. Configuration Example 4

In the above Configuration Example 3, the frequency varying circuit 11 is connected in series to only the parallel arm resonator p1 out of the parallel arm resonator p1 and the parallel arm resonator p2. However, the frequency varying circuit 11 may be connected in series to only the parallel arm resonator p2 out of the parallel arm resonator p1 and the parallel arm resonator p2.

FIG. 13A is a circuit diagram of a filter 20D according to Configuration Example 4.

The filter 20D illustrated in FIG. 13A includes, instead of the parallel arm resonance circuit 21C in the filter 20C illustrated in FIG. 12A, a parallel arm resonance circuit 21D in which the frequency varying circuit 11 is connected in series to only the parallel arm resonator p2 out of the parallel arm resonator p1 and the parallel arm resonator p2.

Thus, in this configuration example, the parallel arm resonator p1 having the resonant frequency and the anti-resonant frequency lower than those of the parallel arm resonator p2 (first parallel arm resonator) is connected in parallel to the parallel arm resonator p2, and the parallel arm resonator p1 corresponds to the second parallel arm resonator having the resonant frequency and the anti-resonant frequency different from those of the parallel arm resonator p2.

FIG. 13B is a graph depicting filter characteristics (band-pass characteristics) of the filter 20D according to Configuration Example 4 of Embodiment 1. More specifically, FIG. 13B is a graph comparatively depicting the filter characteristics when the switch SW is turned on and off.

In the filter 20D, as in the filter 20C, a pass band is formed by setting one of the two anti-resonant frequencies of the parallel arm resonance circuit 21D on the lower frequency side and a resonant frequency of a serial arm resonance circuit (serial arm resonator s1 in this configuration example) close to each other.

In this configuration example, only when the switch SW is turned off, the capacitor C1 is additionally connected to the parallel arm resonator p2. Accordingly, one of the resonant frequencies of the parallel arm resonance circuit 21D on the higher frequency side is shifted in the off-state of the switch SW to the higher frequency side than the resonant frequency of the parallel arm resonator p2 alone. Furthermore, the anti-resonant frequency of the parallel arm resonance circuit 21D on the lower frequency side is shifted in the off-state of the switch SW to the higher frequency side than the anti-resonant frequency in the on-state of the switch SW. Here, an attenuation pole on the higher frequency side of the pass band of the filter 20D is specified by the resonant frequency of the parallel arm resonance circuit 21D on the higher frequency side. Moreover, the sharpness of an attenuation slope on the higher frequency side of the pass band is specified by a differential frequency between the resonant frequency of the parallel arm resonance circuit 21D on the higher frequency side and the anti-resonant frequency thereof on the lower frequency side. In the filter 20D, therefore, with the switch SW being turned off from on, the pass band can be shifted to the higher frequency side in such a manner that the frequency of the attenuation pole on the higher frequency side of the pass band is shifted to the higher frequency side while an increase of insertion loss on the higher frequency side of the pass band is suppressed. In other words, depending on the selective turning-on and -off of the switch SW, the frequency of the attenuation pole on the higher frequency side of the pass band can be shifted and the increase of the insertion loss on the higher frequency side of the pass band can be suppressed at the same time.

4-5. Configuration Example 5

In the above Configuration Example 3, the filter 20C includes the frequency varying circuit 11 that is connected in series to only the parallel arm resonator p1 out of the parallel arm resonator p1 and the parallel arm resonator p2. In the above Configuration Example 4, the filter 20D includes the frequency varying circuit 11 that is connected in series to only the parallel arm resonator p2 out of the parallel arm resonator p1 and the parallel arm resonator p2. However, the filter may include both of the frequency varying circuits 11 connected as described above.

FIG. 14A is a circuit diagram of a filter 20E according to Configuration Example 5.

The filter 20E illustrated in FIG. 14A includes both a frequency varying circuit 11a corresponding to the frequency varying circuit 11 in the filter 20C illustrated in FIG. 12A, and a frequency varying circuit 11b corresponding to the frequency varying circuit 11 in the filter 20D illustrated in FIG. 13A. Thus, a parallel arm resonance circuit 21E in this configuration example includes the frequency varying circuit 11a that is connected in series to only one of the parallel arm resonators p1 and p2 (first parallel arm resonator and second parallel arm resonator), and the frequency varying circuit 11b that is connected in series to only the other of the parallel arm resonators p1 and p2 (first parallel arm resonator and second parallel arm resonator).

In other words, the filter 20E includes the parallel arm resonator p1 as an example of the first parallel arm resonator, the frequency varying circuit 11a connected in series to the parallel arm resonator p1, the parallel arm resonator p2 as an example of the second parallel arm resonator, and the frequency varying circuit 11b connected in series to the parallel arm resonator p2. A circuit including the parallel arm resonator p1 and the frequency varying circuit 11a connected in series to each other and a circuit including the parallel arm resonator p2 and the frequency varying circuit 11b connected in series to each other are connected in parallel.

FIG. 14B is a graph depicting filter characteristics (bandpass characteristics) of the filter 20E according to Configuration Example 5 of Embodiment 1. More specifically, FIG. 14B is a graph comparatively depicting the filter characteristics when switches SW1 and SW2 are turned on and off.

In the filter 20E, only when the switch SW1 is turned off, a capacitor C1 is additionally connected to the parallel arm resonator p1. Moreover, only when the switch SW2 is turned off, a capacitor C2 is additionally connected to the parallel arm resonator p2. Accordingly, one of two resonant frequencies of the parallel arm resonance circuit 21E on the lower frequency side is shifted in the off-state of the switch SW1 to the higher frequency side than the resonant frequency of the parallel arm resonator p1 alone. The other of the two resonant frequencies of the parallel arm resonance circuit 21E on the higher frequency side is shifted in the off-state of the switch SW2 to the higher frequency side than the resonant frequency of the parallel arm resonator p2 alone. Furthermore, an anti-resonant frequency of the parallel arm resonance circuit 21E on the lower frequency side is shifted in the off-state of at least one of the switches SW1 and SW2 to the higher frequency side than the anti-resonant frequency in the on-state of both the switches SW1 and SW2.

In the filter 20E, therefore, with the switches SW1 and SW2 being both turned off from on, the pass band can be shifted to the higher frequency side in such a manner that the frequencies of the attenuation poles on the higher frequency side and the lower frequency side of the pass band are shifted to the higher frequency side while an increase of insertion loss on both the higher frequency side and the lower frequency side of the pass band is suppressed. In other words, depending on the selective turning-on and -off of the switches SW1 and SW2, the frequencies of the attenuation poles on the higher frequency side and the lower frequency side of the pass band can be shifted and the increase of the insertion loss on both the higher frequency side and the lower frequency side of the pass band can be suppressed at the same time. Thus, the filter 20E can shift the center frequency, for example, while the band width is held constant.

The switches SW1 and SW2 are not always required to be turned on and off together, and they may be separately turned on and off. However, when the switches SW1 and SW2 are turned on and off together, the number of control lines for controlling the turning-on and -off of the switches SW1 and SW2 can be reduced, and hence the configuration of the filter 20E can be simplified.

On the other hand, when the switches SW1 and SW2 are separately turned on and off, the number of variations selectable by the filter 20E can be increased.

More specifically, with the configuration described above, a frequency of a higher frequency side end of the pass band can be varied depending on the selective turning-on and -off of the switch SW2 that is connected in series to the parallel arm resonator p2. Furthermore, a frequency of a lower frequency side end of the pass band can be varied depending on the selective turning-on and -off of the switch SW1 that is connected in series to the parallel arm resonator p1.

With the configuration described above, therefore, the lower frequency side end and the higher frequency side end of the pass band can be both shifted to the lower frequency side or the higher frequency side by turning on or off the switches SW1 and SW2 together. In other words, the center frequency of the pass band can be shifted to the lower frequency side or the higher frequency side. Furthermore, both the lower frequency side end and the higher frequency side end of the pass band can be shifted so as to widen or narrow a frequency difference between the lower frequency side end and the higher frequency side end by turning one of the switches SW1 and SW2 off from on and turning the other of the switches SW1 and SW2 on from off. In other words, a pass band width can be varied while the center frequency of the pass band is held substantially constant. Moreover, one of the lower frequency side end and the higher frequency side end of the pass band can be shifted to the lower frequency side or the higher frequency side while the other of the lower frequency side end and the higher frequency side end is held in a fixed state, by turning one of the switches SW1 and SW2 on and off while the other of the switches SW1 and SW2 is held in the turned-on or -off state. In other words, the lower frequency side end or the higher frequency side end of the pass band can be varied.

Thus, the filter 20E can increase the degree of freedom in varying the pass band with the provision of both the frequency varying circuit 11a that is connected in series to only the parallel arm resonator p1 out of the parallel arm resonator p1 and the parallel arm resonator p2, and the frequency varying circuit 11b that is connected in series to only the parallel arm resonator p2 out of the parallel arm resonator p1 and the parallel arm resonator p2.

In order to realize the size reduction and the loss reduction in the radio frequency front-end circuit including the filter 20E, an on-resistance Ron1 of the switch 12a of the switching circuit 10 is preferably smaller than the on-resistance of the switch SW1 and an on-resistance of the switch SW2. Furthermore, the switch 12a and the switch SW1 are preferably constituted such that an on-resistance ratio representing a ratio of the on-resistance Ron1 of the switch 12a to the on-resistance of the switch SW1 falls within the above-mentioned range of greater than α and smaller than 1. Similarly, the switch 12a and the switch SW2 are preferably constituted such that an on-resistance ratio representing a ratio of the on-resistance Ron1 of the switch 12a to the on-resistance of the switch SW2 falls within the above-mentioned range of greater than α and smaller than 1. It is to be noted that only one of the switches SW1 and SW2 may be constituted so as to satisfy the above-described relation.

4-6. Configuration Example 6

In the above Configuration Example 3, the frequency varying circuit 11 is connected in series to only the parallel arm resonator p1 out of the parallel arm resonator p1 and the parallel arm resonator p2. In the above Configuration Example 4, the frequency varying circuit 11 is connected in series to only the parallel arm resonator p2 out of the parallel arm resonator p1 and the parallel arm resonator p2. However, the parallel arm resonator p1 and the parallel arm resonator p2 may be connected in parallel to each other, and the frequency varying circuit 11 may be connected in series to a circuit including the parallel arm resonator p1 and the parallel arm resonator p2 connected in parallel to each other.

FIG. 15A is a circuit diagram of a filter 20F according to Configuration Example 6.

The filter 20F illustrated in FIG. 15A includes a parallel arm resonance circuit 21F including the frequency varying circuit 11 that is connected in series to the circuit including the parallel arm resonator p1 and the parallel arm resonator p2 connected in parallel to each other.

FIG. 15B is a graph depicting filter characteristics (bandpass characteristics) of the filter 20F according to Configuration Example 6 of Embodiment 1. More specifically, FIG. 15B is a graph comparatively depicting the filter characteristics when the switch SW is turned on and off.

In the filter 20F, as in the filter 20C, a pass band is formed by setting one of two anti-resonant frequencies of the parallel arm resonance circuit 21F on the lower frequency side and a resonant frequency of a serial arm resonance circuit (serial arm resonator s1 in this configuration example) close to each other.

In this configuration example, only when the switch SW is turned off, the capacitor C1 is additionally connected to both the parallel arm resonators p1 and p2. Accordingly, one of the two resonant frequencies of the parallel arm resonance circuit 21F on the lower frequency side is shifted in the off-state of the switch SW to the higher frequency side than the resonant frequency of the parallel arm resonator p1 alone. Furthermore, the other of the two resonant frequencies of the parallel arm resonance circuit 21F on the higher frequency side is shifted in the off-state of the switch SW to the higher frequency side than the resonant frequency of the parallel arm resonator p2 alone. However, the anti-resonant frequency of the parallel arm resonance circuit 21F on the lower frequency side is not shifted in the off-state of the switch SW because the frequency varying circuit 11 is connected in series to the circuit including the parallel arm resonator p1 and the parallel arm resonator p2 connected in parallel to each other. In the filter 20F, therefore, with the switch SW being turned off from on, frequencies of attenuation poles on both the sides of the pass band can be both shifted to the higher frequency side together. In other words, the filter 20F can shift the frequencies of the attenuation poles on both the sides of the pass band together depending on the selective turning-on and -off of the switch SW.

4-7. Configuration Example 7

The above description has been made about the configuration of the filter (tunable filter) in which a capacitor or an inductor is disposed as the first impedance element. However, the first impedance element may be a third parallel arm resonator having a resonant frequency higher than that of the parallel arm resonator p1 (first parallel arm resonator) and an anti-resonant frequency higher than that of the parallel arm resonator p1. From that point of view, this configuration example is described, by way of example, in connection with an acoustic wave resonator in which the parallel arm resonator p2 described in Configuration Examples 3 to 6 is connected, as the third parallel arm resonator, in series to the parallel arm resonator p1.

FIG. 16A is a circuit diagram of a filter 20G according to Configuration Example 7.

In the filter 20G illustrated in FIG. 16A, the switch SW is connected in parallel to the parallel arm resonator p2, and constitutes a frequency varying circuit 11G together with the parallel arm resonator p2. The frequency varying circuit 11G is connected in series to the parallel arm resonator p1 (first parallel arm resonator), and constitutes a parallel arm resonance circuit 21G in cooperation with the parallel arm resonator p1.

FIG. 16B is a graph depicting filter characteristics (bandpass characteristics) of the filter 20G according to Configuration Example 7 of Embodiment 1. More specifically, FIG. 16B is a graph comparatively depicting the filter characteristics when the switch SW is turned on and off.

In the filter 20G having the above-described configuration, only when the switch SW is turned off, the parallel arm resonator p2 is additionally connected to the parallel arm resonator p1. Accordingly, the parallel arm resonance circuit 21G exhibits the characteristics given by the parallel arm resonator p1 alone when the switch SW is turned on, and the combined characteristics of both the parallel arm resonator p1 and the parallel arm resonator p2 when the switch SW is turned off.

Thus, in the off-state of the switch SW in the parallel arm resonance circuit 21G, a resonant frequency on the lower frequency side is formed on the higher frequency side than the resonant frequency of the parallel arm resonator p1 alone, and a resonant frequency on the higher frequency side is formed between the anti-resonant frequency of the parallel arm resonator p1 alone and the anti-resonant frequency of the parallel arm resonator p2 alone. In the filter 20G, therefore, with the switch SW being turned off from on, a frequency of an attenuation pole on the lower frequency side of the pass band is shifted to the higher frequency side. Moreover, a new attenuation pole is added on the higher frequency side of the pass band, whereby the attenuation on the higher frequency side of the pass band can be obtained. In other words, depending on selective turning-on and -off of the switch SW, the filter 20G can shift the frequency of the attenuation pole on the lower frequency side of the pass band, and can change the number of attenuation poles on the higher frequency side of the pass band.

Embodiment 2

Although, in the above Embodiment 1, the filter 20 has been described in connection with an example having a ladder filter structure of one stage for the sake of simplicity, the filter 20 may have a ladder filter structure of multiple stages. From that point of view, this Embodiment 2 illustrates a tunable filter having the ladder filter structure of multiple stages in connection with, for example, a duplexer in which a transmit filter is constituted by the tunable filter.

FIG. 17A is a circuit diagram of a duplexer 20DPX according to Embodiment 2.

The duplexer 20DPX illustrated in FIG. 17A includes a transmit filter 20TX disposed between an antenna terminal ANT and a transmitting terminal TX, and a receive filter 20RX disposed between the antenna terminal ANT and a receiving terminal RX. The transmit filter 20TX and the receive filter 20RX are connected in common on the side closer to the antenna terminal ANT.

The transmit filter 20TX includes serial arm resonators s11 to S15, parallel arm resonators p11, p12a, p12b, p13a, p13b, p14a and p14b, and an inductor L15. Here, resonant frequencies of the parallel arm resonators p12a, p13a and p14a are lower than those of the parallel arm resonators p12b, p13b and p14b and the serial arm resonator s11 to s15, and anti-resonant frequencies of the parallel arm resonators p12a, 13a and 14a are lower than those of the parallel arm resonators p12b, p13b and p14b and the serial arm resonators s11 to s15.

The transmit filter 20TX further includes capacitors C11 to C13 (first impedance elements) for varying a pass band, and switches SW11 to SW13 (third switches).

The capacitor C11 and the switch SW11 are connected in parallel to constitute one frequency varying circuit, and are connected in series to the parallel arm resonator p11. The capacitor C12 and the switch SW12 are connected in parallel to constitute one frequency varying circuit, and are connected in series to the parallel arm resonator p12a. The capacitor C13 and the switch SW13 are connected in parallel to constitute one frequency varying circuit, and are connected in series to a circuit including the parallel arm resonator p13a and the parallel arm resonator p13b connected in parallel to each other.

Thus, the transmit filter 20TX is a tunable filter having one stage of the configuration of the filter 20A according to Configuration Example 1 of Embodiment 1, one stage of the configuration of the filter 20C according to Configuration Example 3 of Embodiment 1, and one stage of the configuration of the filter 20F according to Configuration Example 6 of Embodiment 1.

The receive filter 20RX includes an inductor L21, a serial arm resonator s21, longitudinally-coupled resonators s22 and s23, a parallel arm resonator p24, and an inductor L24.

FIG. 17B is a graph depicting filter characteristics (band-pass characteristics) of the transmit filter 20TX in the duplexer 20DPX having the above-described configuration. As seen from FIG. 17B, the transmit filter 20TX can shift (vary) a pass band and a frequency of an attenuation band by selectively turning on and off the switches SW11 to SW13 (tuning switches) of the frequency varying circuits.

FIG. 17C is a graph comparatively depicting an RF voltage (denoted by a solid line in the graph) applied to the switch SW11 of the frequency varying circuit, which is subjected to a maximum voltage in an off-state, and an RF voltage (denoted by a dotted line in the graph) applied to the switch 12a of the switching circuit 10 in an off-state, when electric power of 36 dBm is applied to the transmit terminal TX.

As seen from FIG. 17C, a voltage of 17 V is applied to the switch 12a of the switching circuit 10 in the pass band, and a voltage of 23 V is applied to the switch SW of the frequency varying circuit 11 in the pass band.

Because the relatively high RF voltage is applied to each of the switches SW11 to SW13 of the frequency varying circuits in the off-state as described above, the RF voltage is divided by connecting a plurality of FETs in series. For instance, when the withstand voltage for each of the FETs constituting the switch is about 2.5 V, ten FETs need to be connected in series for each of the switches SW11 to SW13 because the switches SW11 to SW13 are required to have the withstand voltage of 23 V. Thus, the number of stacks necessary for each of the switches SW11 to SW13 is 10. On the other hand, in the switching circuit 10, seven FETs need to be connected in series, and the number of necessary stacks is 7.

As described above, higher RF voltages are applied to the switches SW11 to SW13 of the frequency varying circuits than to the switch 12a of the switching circuit 10 in the off-state. Thus, by setting the number of one or more FETs constituting each of the switches SW11 to SW13 (third switch elements) of the frequency varying circuits to be greater than the number of one or more FETs constituting the switch 12a (first switch element) of the switching circuit 10, it is possible to improve the withstand voltage characteristics of the switches SW11 to SW13 of the frequency varying circuits and to improve the electric power handling characteristics in the transmit filter 20TX.

In the case of one tunable filter (transmit filter 20TX in this embodiment) including a plurality of frequency varying circuits, if packages for switches of the frequency varying circuits are separately provided, a control circuit is needed for each of the packages. In that case, therefore, a total mounting area for the switches of the frequency varying circuits is increased. The total mounting area for the switches of the frequency varying circuits can be reduced by incorporating the plurality of frequency varying circuits into one package, namely by forming the plurality of switches on or in one semiconductor substrate.

FIG. 18A is a plan view schematically illustrating a semiconductor substrate 202 on or in which switches of the plurality of frequency varying circuits are formed.

As illustrated in FIG. 18A, the semiconductor substrate 202 includes four SPST switches for switching over conduction and non-conduction between terminals formed as electrodes P1 to P4 and ground terminals formed as ground electrodes. Here, the ground electrodes for two switches adjacent to each other are constituted as one electrode in common. In the semiconductor substrate 202 in which the ground electrodes are constituted in common as described above, the number of the terminals for the connection to an external substrate can be reduced and size reduction is realized. Thus, an overall size of the tunable filter can be reduced.

The semiconductor substrate 202 further includes a control circuit 220 that is operated with a power supply voltage VDD supplied from a power supply circuit such as a power management IC, and that produces, in accordance with a control signal VC1 inputted from an RFIC, for example, a plurality of switch drive voltages to individually turn on and off the four switches formed on or in the semiconductor substrate 202.

Alternatively, switches (switches 12a, 12b, 13a and 13b) of the switching circuit 10 and the switches of the frequency varying circuits in the tunable filter may be incorporated into one package.

FIG. 18B is a plan view schematically illustrating a semiconductor substrate 203 on or in which the switches of the switching circuit 10 and the switches of the frequency varying circuits are both formed.

In the semiconductor substrate 203 illustrated in FIG. 18B, the semiconductor substrate 201 illustrated in FIG. 2B and the semiconductor substrate 202 illustrated in FIG. 18A are constituted as one substrate.

The semiconductor substrate 203 includes a control circuit 230 having both the function of the control circuit 210 illustrated in FIG. 2B and the function of the control circuit 220 illustrated in FIG. 18A. More specifically, the control circuit 230 is operated with a power supply voltage VDD supplied from a power supply circuit such as a power management IC, and that produces, in accordance with a control signal VC1 inputted from an RFIC, for example, a plurality of switch drive voltages to individually turn on and off the switches of the switching circuit 10 and the switches of the frequency varying circuits, those switches being formed on or in the semiconductor substrate 203.

Thus, since the switches of the switching circuit 10 and the switches of the frequency varying circuits are formed on or in one semiconductor substrate 203, a total mounting area for the switches of the radio frequency front-end circuit can be reduced.

Embodiment 3

The configurations described above in Embodiments 1 and 2 and the modifications thereof can be applied to, for example, a radio frequency front-end circuit including three or more filters. From that point of view, this Embodiment 3 illustrates such a radio frequency front-end circuit.

FIG. 19 is a block diagram of a radio frequency front-end circuit 1A according to Embodiment 3 and peripheral circuits thereof. FIG. 19 illustrates the radio frequency front-end circuit 1A, an antenna element 2, and an RFIC (Radio Frequency Integrated Circuit) 3. The radio frequency front-end circuit 1A and the RFIC 3 constitute a communication device 4. The antenna element 2, the radio frequency front-end circuit 1A, and the RFIC 3 are disposed, for example, in a front-end section of a cellular phone adaptable for a multimode and multiband system.

The antenna element 2 is a multiband-adaptable antenna that transmits and receives radio frequency signals, and that is in conformity with the communication standards such as 3 GPP (Third Generation Partnership Project). The antenna element 2 is not always needed to be adaptable for all bands of the communication device 4, and it may be adaptable for only a lower frequency band group or a higher frequency band group, for example. The antenna element 2 may be disposed separately from the communication device 4 instead of being built in the communication device 4.

The RFIC 3 is an RF signal processing circuit for processing radio frequency signals that are transmitted from and received by the antenna element 2. More specifically, the RFIC 3 executes signal processing, such as down-conversion, of a radio frequency signal (here, a radio frequency receive signal) that is inputted from the antenna element 2 via a receive-side signal path in the radio frequency front-end circuit 1A, and then outputs a receive signal, which is generated through the signal processing, to a base-band signal processing circuit (not illustrated). Furthermore, the RFIC 3 executes signal processing, such as up-conversion, of a transmit signal that is inputted from the base-band signal processing circuit, and then outputs a radio frequency signal (here, a radio frequency transmit signal), which is generated through the signal processing, to a transmit-side signal path (not illustrated) in the radio frequency front-end circuit 1A.

The radio frequency front-end circuit 1A is a circuit for transferring the radio frequency signals between the antenna element 2 and the RFIC 3. More specifically, the radio frequency front-end circuit 1A transfers the radio frequency signal (here, the radio frequency transmit signal), which is outputted from the RFIC 3, to the antenna element 2 via the transmit-side signal path (not illustrated). Furthermore, the radio frequency front-end circuit 1A transfers the radio frequency signal (here, the radio frequency receive signal), which is received by the antenna element 2, to the RFIC 3 via the receive-side signal path.

The radio frequency front-end circuit 1A includes a variable impedance matching circuit 100, a switch group 110, a filter group 120, switch groups 150A and 150B, and a reception amplifier circuit group 160, which are successively disposed from the side closer to the antenna element 2.

The switch group 110 is a switch circuit constituted by a plurality of switches and connecting the antenna element 2 to a filter corresponding to a predetermined band in accordance with a control signal from a control unit (not illustrated). The number of filters to be connected to the antenna element 2 is not limited to one, and it may be plural.

The filter group 120 is constituted by a plurality of filters. In this embodiment, the filter group 120 is constituted by the following first to sixth filters, for example. The first filter is a tunable filter adaptable for CA of Band29 and Band12, 67 and 13. The second filter is a tunable filter adaptable for CA of Band68 and 28a, CA of Band28a and 28b, and CA of Band28a and 20. The above-described filter 20 according to Embodiment 2 can be used as the second filter. The third to sixth filters are each a filter having a fixed pass band. The third filter is adapted for Band20, the fourth filter is adapted for Band27, the fifth filter is adapted for Band26, and the sixth filter is adapted for Band8.

The switch groups 150A and 150B are switch circuits constituted by a plurality of switches and connecting the filter corresponding to a predetermined band to a reception amplifier circuit in the reception amplifier circuit group 160 corresponding to the predetermined band. The number of filters to be connected to the reception amplifier circuit is not limited to one, and it may be plural.

The reception amplifier circuit group 160 is constituted by one or more low-noise amplifiers (plurality of low-noise amplifiers in this embodiment) for amplifying the powers of the radio frequency receive signals inputted from the switch groups 150A and 150B.

The radio frequency front-end circuit 1A having the above-described configuration causes the radio frequency signal (here, the radio frequency receive signal), which is inputted from the antenna element 2, to pass through a predetermined filter allowing the passage of the radio frequency signal in the predetermined band, amplifies the radio frequency receive signal by the predetermined low-noise amplifier, and then outputs the amplified signal to the RFIC 3. The RFIC may be separately provided as an RFIC adapted for a low band and an RFIC adapted for a high band.

Each of the first filter and the second filter (tunable filters) includes the frequency varying circuit described above in Embodiment 1 or 2. Furthermore, an on-resistance of the switch in the switch group 110 (first switch element of the switch circuit) is smaller than that of the switch (third switch element, not illustrated) of the frequency varying circuit in the corresponding tunable filter. More specifically, the on-resistance of one among the plurality of switches in the switch group 110, the one being connected to the first filter, is smaller than that of the switch of the frequency varying circuit in the first filter. Furthermore, the on-resistance of one among the plurality of switches in the switch group 110, the one being connected to the second filter, is smaller than that of the switch of the frequency varying circuit in the second filter.

Thus, the configuration of the radio frequency front-end circuit 1A according to this embodiment can also realize the size reduction and can reduce the loss in the pass band concurrently as in Embodiment 1.

In addition, preferably, an on-resistance of each switch in the switch groups 150A and 150B is smaller than that of the switch of the frequency varying circuit in the tunable filter. More specifically, an on-resistance of one among the plurality of switches in the switch groups 150A and 150B, the one being connected to the first filter, is smaller than that of the switch of the frequency varying circuit in the first filter. An on-resistance of one among the plurality of switches in the switch groups 150A and 150B, the one being connected to the second filter, is smaller than that of the switch of the frequency varying circuit in the second filter.

Thus, since the on-resistance of each of the switch disposed upstream of the tunable filter and the switch disposed downstream of the tunable filter is smaller than that of the switch of the frequency varying circuit in the tunable filter, further size reduction and further loss reduction in the pass band can be realized concurrently.

The on-resistance of only one of the switch disposed upstream of the tunable filter and the switch disposed downstream of the tunable filter may be smaller than that of the switch of the frequency varying circuit in the tunable filter. In other words, the radio frequency front-end circuit 1A may include, instead of the antenna terminal 101 illustrated in FIG. 1, a common terminal connected to an amplifier circuit such as a low-noise amplifier.

This embodiment has been described above in connection with the radio frequency front-end circuit 1A having the configuration for reception diversity in which a plurality of filters (receive filters) are disposed in the receive-side signal path. However, the radio frequency front-end circuit is not limited to that configuration, and it may have a configuration for transmission diversity in which a plurality of filters (transmit filters) are disposed in the transmit-side signal path. Moreover, the radio frequency front-end circuit is not limited to the diversity configuration including a plurality of receive filters or a plurality of transmit filters, and it may have a configuration for transmission and reception in which at least one transmit filter and at least one receive filter are disposed.

Other Embodiments

Although the radio frequency front-end circuit according to the embodiment of the present invention has been described above in connection with Embodiments 1 to 3, the present invention is not limited to the above embodiments. The present invention further encompasses other embodiments realized by combining optional constituent elements in the above embodiments, modifications obtained by variously modifying the above embodiments based on ideas conceived by those skilled in the art within a scope not departing from the gist of the present invention, and various apparatuses incorporating the radio frequency front-end circuit according to the present invention.

For example, the communication device 4 including the above-described radio frequency front-end circuit and the RFIC (Radio Frequency Integrated Circuit) 3, or a multiplexer including a plurality of filters connected in common through a switch circuit also falls within the scope of the present invention. With the communication device 4 and the multiplexer, the size reduction can be realized and the loss in the pass band can be reduced concurrently.

As described above, when the on-resistance ratio Ron1/Ron2 is changed with the insertion loss set to an arbitrary fixed value, the total area of the FET sections is expressed by a function having a downward convex shape, and the switch of the switching circuit 10 (first switch element) and the switch of the frequency varying circuit (third switch element) are constituted such that the on-resistance ratio Ron1/Ron2 falls within the range of greater than $\alpha$ and smaller than 1. However, a value of $\alpha$ depends on various parameters such as the configuration, the material, and the structure of the FET sections, and it becomes a very small value in some cases. In such a case, $\alpha$ is often not uniquely determined due to variations in the FET sections, etc. caused by manufacturing processes. For that reason, the range of the on-resistance ratio is not limited to the above-mentioned range, and it may be given, for example, as a range of greater than 0 and smaller than 1.

The serial arm resonance circuit s20 may be constituted by a plurality of acoustic wave resonators without being limited to one acoustic wave resonator (serial arm resonator). Thus, the serial arm resonance circuit may be a longitudinally-coupled resonator including a plurality of acoustic wave resonators. The filter 20 having such a configuration can be adapted for filter characteristics in the case that, for example, enhancement of attenuation is demanded. The serial arm resonance circuit may be constituted using an impedance element, such as an inductor or a capacitor, without being limited to the acoustic wave resonator.

One acoustic wave resonator (one serial arm resonator and one parallel arm resonator) may be constituted by a plurality of split resonators that are formed, for example, by splitting the one acoustic wave resonator in series.

The first switch element and the third switch element may be each constituted by a CMOS (Complementary Metal Oxide Semiconductor) FET. The first switch element and the third switch element are not limited to the FETs, and they may be each a diode switch that is constituted using a diode. Furthermore, the first switch element and the third switch element are not limited to semiconductor switches formed on or in a semiconductor substrate, and they may be each a mechanical switch that is formed by utilizing MEMS, for example.

At least one of the first switch element and the third switch element is not limited to the configuration in which the switch element is constituted by a plurality of split switch elements formed by splitting one switch element in series, and it may be constituted by one switch element.

In the radio frequency front-end circuit or the communication device, for example, an inductor or a capacitor may be connected between adjacent constituent elements. In such a case, the inductor may include a wiring inductor that is generated by wiring connecting the adjacent constituent elements.

The present invention can be utilized as a multiplexer, a radio frequency front-end circuit, and a communication device each of which has a small size and a small loss, and can be widely applied to communication apparatuses such as a cellular phone.

1, 1A radio frequency front-end circuit
2 antenna element
3 RFIC (Radio Frequency Integrated Circuit)
4 communication device
10 switching circuit
11, 11B, 11G frequency varying circuit
11e unit element constituting FET
11p FET
12a switch (first switch element)
12b, 13b switch
13a switch (second switch element)
20, 20A to 20G filter (first filter)
20DPX duplexer
20RX receive filter
20TX transmit filter
21, 21B to 21G parallel arm resonance circuit
30 filter (second filter)
101 antenna terminal
102, 103 individual terminal
110, 150A, 150B switch group
111 common terminal
112, 113 select terminal
120 filter group 121 input/output terminal (first input/output terminal)
122 input/output terminal (second input/output terminal)
160 reception amplifier circuit group
201 semiconductor substrate
210 control circuit
211 diffusion layer
213 channel layer
221 gate electrode
221D drain electrode
221G gate electrode
221S source electrode
222 insulating film
C, C1, C11 to C13, C32 to C34 capacitor (first impedance element)
L inductor (second impedance element)
L15, L21, L24, Lant inductor
p1, p2, p11, p12a, p12b, p13a, p13b, p14a, p14b, p31, p32a, p32b, p33a, p33b, p34a, p34b, p35, p36 parallel arm resonator (first parallel arm resonator, second parallel arm resonator)
s1, s11 to s15, s21, s31 to s35 serial arm resonator
s20 serial arm resonance circuit
s22, s23 longitudinally-coupled resonator
SW, SW1, SW2, SW11 to SW13, SW32 to SW34 switch (third switch element)

The invention claimed is:

1. A radio frequency front-end circuit comprising:
a switch circuit having a common terminal, a first select terminal, and a second select terminal, the first and second select terminals being selectively connected to the common terminal;
a first filter that is a frequency variable filter connected to the first select terminal; and
a second filter connected to the second select terminal, the switch circuit comprising:
a first switch element that switches over conduction and non-conduction between the common terminal and the first select terminal; and
a second switch element that switches over conduction and non-conduction between the common terminal and the second select terminal,
the first filter comprising:
a first input/output terminal and a second input/output terminal;
at least one serial arm resonance circuit connected to the first select terminal and disposed in a path connecting the first input/output terminal and the second input/output terminal;
a first parallel arm resonator connected between a node on the path and a ground; and
a frequency varying circuit including a first impedance element and a third switch element connected in parallel to each other, said frequency varying circuit being connected in series to the first parallel arm resonator between the node and the ground,
wherein the frequency varying circuit is configured to shift a frequency of at least one attenuation pole of the first filter depending on switching between conduction and non-conduction state of the third switch element, and
an on-resistance of the first switch element is smaller than an on-resistance of the third switch element.

2. The radio frequency front-end circuit according to claim 1, wherein:
the first input/output terminal is connected to the first select terminal,
an on-resistance ratio given as a value of the on-resistance of the first switch element relative to the on-resistance of the third switch element is changed when an insertion loss between the common terminal and the second input/output terminal in a pass band of the first filter in a conduction state of both the first switch element and the third switch element is set to an arbitrary fixed value,
a total area of an area in which the first switch element is provided and an area in which the third switch element is provided is expressed by a function having a downward convex shape and taking a minimum value when the on-resistance ratio is less than 1, and
the first switch element and the third switch element are arranged such that the on-resistance ratio falls within a range of greater than a and smaller than 1 when the total area obtained when the on-resistance ratio is 1 is a reference area, and when the on-resistance ratio obtained when the total area takes the reference area in a monotonously decreasing region of the function having the downward convex shape is denoted by α.

3. The radio frequency front-end circuit according to claim 2, wherein the first switch element and the third switch element are arranged such that the on-resistance ratio falls within a range of greater than 0.24 and smaller than 1.

4. The radio frequency front-end circuit according to claim 2, wherein each of the first switch element and the third switch element comprises one switch element or a plurality of switch elements formed by splitting one switch element in series, and
a number of switch elements constituting the third switch element is greater than the number of switch elements constituting the first switch element.

5. The radio frequency front-end circuit according to claim 2, wherein the first impedance element is one of an inductor element and a capacitor element,
the frequency varying circuit further includes a second impedance element that is the other of the inductor element and the capacitor element, and that is connected in series to the third switch element, and
the third switch element is connected in parallel to the first impedance element via the second impedance element.

6. The radio frequency front-end circuit according to claim 1, wherein each of the first switch element and the third switch element comprises one switch element or a plurality of switch elements in series, and
a number of switch elements constituting the third switch element is greater than the number of switch elements constituting the first switch element.

7. The radio frequency front-end circuit according to claim 6, wherein at least one of the first switch element and the third switch element is an FET (Field Effect Transistor).

8. The radio frequency front-end circuit according to claim 6, wherein each of the plurality of switch elements in series is an FET (Field Effect Transistor).

9. The radio frequency front-end circuit according to claim 6, wherein the first filter further comprises a second parallel arm resonator connected between the node and the ground, and
wherein a resonant frequency of the second parallel arm resonator is different from a resonant frequency of the first parallel arm resonator, and an anti-resonant frequency of the second parallel arm resonator is different from an anti-resonant frequency of the first parallel arm resonator.

10. The radio frequency front-end circuit according to claim 6, wherein the first impedance element is a third parallel arm resonator having a resonant frequency higher than a resonant frequency of the first parallel arm resonator and an anti-resonant frequency higher than an anti-resonant frequency of the first parallel arm resonator.

11. A communication device comprising:
   a radio frequency integrated circuit configured to process radio frequency signals transmitted from and received by an antenna element; and
   the radio frequency front-end circuit according to claim 6, the radio frequency front-end circuit configured to transfer the radio frequency signals between the antenna element and the radio frequency integrated circuit.

12. The radio frequency front-end circuit according to claim 1, wherein the first switch element and the third switch element are provided on a same semiconductor substrate.

13. The radio frequency front-end circuit according to claim 1, wherein the first filter further comprises a second parallel arm resonator connected between the node and the ground, and
   wherein a resonant frequency of the second parallel arm resonator is different from a resonant frequency of the first parallel arm resonator, and an anti-resonant frequency of the second parallel arm resonator is different from an anti-resonant frequency of the first parallel arm resonator.

14. The radio frequency front-end circuit according to claim 13, wherein:
   the second parallel arm resonator is connected in parallel to a circuit including the first parallel arm resonator and the frequency varying circuit connected in series to each other,
   the resonant frequency of the second parallel arm resonator is lower than the resonant frequency of the first parallel arm resonator, and
   the anti-resonant frequency of the second parallel arm resonator is lower than the anti-resonant frequency of the first parallel arm resonator.

15. The radio frequency front-end circuit according to claim 13, wherein:
   the second parallel arm resonator is connected in parallel to a circuit including the first parallel arm resonator and the frequency varying circuit connected in series to each other,
   the resonant frequency of the second parallel arm resonator is higher than the resonant frequency of the first parallel arm resonator, and
   the anti-resonant frequency of the second parallel arm resonator is higher than the anti-resonant frequency of the first parallel arm resonator.

16. The radio frequency front-end circuit according to claim 13, wherein the first parallel arm resonator and the second parallel arm resonator are connected in parallel to each other, and
   the frequency varying circuit is connected in series to a circuit including the first parallel arm resonator and the second parallel arm resonator connected in parallel to each other.

17. The radio frequency front-end circuit according to claim 13, wherein the first filter further comprises another frequency varying circuit that is connected in series to the second parallel arm resonator between the node and the ground, and
   the circuit including the first parallel arm resonator and the frequency varying circuit connected in series to each other is connected in parallel to a circuit including the second parallel arm resonator and the other frequency varying circuit connected in series to each other.

18. The radio frequency front-end circuit according to claim 1, wherein the first impedance element is one of an inductor element and a capacitor element,
   the frequency varying circuit further includes a second impedance element that is the other of the inductor element and the capacitor element, and that is connected in series to the third switch element, and
   the third switch element is connected in parallel to the first impedance element via the second impedance element.

19. The radio frequency front-end circuit according to claim 1, wherein the first impedance element is a third parallel arm resonator having a resonant frequency higher than a resonant frequency of the first parallel arm resonator and an anti-resonant frequency higher than an anti-resonant frequency of the first parallel arm resonator.

20. A communication device comprising:
   a radio frequency integrated circuit configured to process radio frequency signals transmitted from and received by an antenna element; and
   the radio frequency front-end circuit according to claim 1, the radio frequency front-end circuit configured to transfer the radio frequency signals between the antenna element and the radio frequency integrated circuit.

21. The radio frequency front-end circuit according to claim 1, wherein the first parallel arm resonator is connected between the node on the path and the ground via the frequency varying circuit.

\* \* \* \* \*